(12) United States Patent
Morozumi

(10) Patent No.: US 12,512,388 B2
(45) Date of Patent: Dec. 30, 2025

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Akira Morozumi, Okaya (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 505 days.

(21) Appl. No.: 17/851,818

(22) Filed: Jun. 28, 2022

(65) Prior Publication Data

US 2023/0067725 A1 Mar. 2, 2023

(30) Foreign Application Priority Data

Aug. 25, 2021 (JP) .................................. 2021-137554

(51) Int. Cl.
*H01L 21/50* (2006.01)
*H01L 23/04* (2006.01)
(Continued)

(52) U.S. Cl.
CPC ........ *H01L 23/4006* (2013.01); *H01L 23/053* (2013.01); *H01L 23/14* (2013.01);
(Continued)

(58) Field of Classification Search
CPC ... H01L 23/4006; H01L 23/053; H01L 23/14; H01L 23/3107; H01L 23/498;
(Continued)

(56) References Cited

U.S. PATENT DOCUMENTS 7,808,100 B2 * 10/2010 Bayerer ................ H01L 25/072
257/E23.101
8,319,335 B2 * 11/2012 Bayerer .............. H01L 23/4952
257/565
(Continued)

FOREIGN PATENT DOCUMENTS

DE  3508456 A1 * 9/1986
EP  2814055 A1    12/2014
(Continued)

OTHER PUBLICATIONS

Japanese Patent Office Action issued on Mar. 18, 2025, for corresponding Japanese Patent Application No. 2021-137554.
(Continued)

*Primary Examiner* — Dale E Page
*Assistant Examiner* — Cristian A Tivarus
(74) *Attorney, Agent, or Firm* — Rabin & Berdo, P.C.

(57) ABSTRACT

A semiconductor device includes an insulated substrate, a semiconductor element mounted on a first main surface side of the insulated substrate, and a case housing that houses the insulated substrate and the semiconductor element so that a second main surface side of the insulated substrate is exposed. The outer circumferential portion of the insulated substrate is bonded to the case housing. The case housing is provided with a screw hole at a position facing the first main surface side of the insulated substrate. The semiconductor device further includes a screw that is screwed into a screw hole in the case housing and has a tip portion that contacts the first main surface side of the insulated substrate.

17 Claims, 20 Drawing Sheets

(51) Int. Cl.
*H01L 23/053* (2006.01)
*H01L 23/10* (2006.01)
*H01L 23/14* (2006.01)
*H01L 23/31* (2006.01)
*H01L 23/40* (2006.01)
*H01L 23/498* (2006.01)
*H01L 23/18* (2006.01)

(52) U.S. Cl.
CPC ........ *H01L 23/3107* (2013.01); *H01L 23/498* (2013.01); *H01L 23/18* (2013.01)

(58) Field of Classification Search
CPC ......... H01L 23/18; H01L 21/50; H01L 23/04; H01L 23/10; H01L 23/562; H01L 23/3735
See application file for complete search history.

(56) References Cited

U.S. PATENT DOCUMENTS

| | | | |
|---|---|---|---|
| 9,627,343 B2* | 4/2017 | Kroneder | ................ H01L 24/34 |
| 9,865,529 B2* | 1/2018 | Sato | .................... H01L 23/3736 |
| 2009/0261472 A1 | 10/2009 | Bayerer | |
| 2014/0374898 A1 | 12/2014 | Komatsu | |
| 2015/0115282 A1 | 4/2015 | Takahashi et al. | |
| 2015/0303126 A1* | 10/2015 | Takahashi | ......... H01L 23/49894 257/77 |
| 2018/0096937 A1 | 4/2018 | Saegusa | |
| 2018/0184538 A1 | 6/2018 | Bayerer | |
| 2019/0057914 A1 | 2/2019 | Nakahara | |
| 2019/0103334 A1 | 4/2019 | Tanaka | |
| 2019/0355657 A1 | 11/2019 | Miyasaka | |
| 2022/0005745 A1 | 1/2022 | Kato et al. | |

FOREIGN PATENT DOCUMENTS

| | | | | |
|---|---|---|---|---|
| EP | 3182448 | A1 | 6/2017 | |
| EP | 3340291 | A1 | 6/2018 | |
| JP | 09134983 | A * | 5/1997 | |
| JP | 2000133769 | A | 5/2000 | |
| JP | 2004-288828 | A | 10/2004 | |
| JP | 2006066427 | A * | 3/2006 | |
| JP | 2011134949 | A * | 7/2011 | |
| JP | 2012222173 | A | 11/2012 | |
| JP | 5576528 | B2 | 8/2014 | |
| JP | 2015008242 | A * | 1/2015 | ............. H01L 24/36 |
| JP | 2015088653 | A | 5/2015 | |
| JP | 2015-216349 | A | 12/2015 | |
| JP | 2016-096188 | A | 5/2016 | |
| JP | 2016-134552 | A | 7/2016 | |
| JP | 2018056437 | A | 4/2018 | |
| JP | 2019-036677 | A | 3/2019 | |
| JP | 2019067886 | A | 4/2019 | |
| JP | 2019-201114 | A | 11/2019 | |
| JP | 6849137 | B1 | 3/2021 | |
| WO | 2014/013883 | A1 | 1/2014 | |

OTHER PUBLICATIONS

Japanese Patent Office Action issued for corresponding JP Patent Application No. 2021-137554 on Jul. 8, 2025.

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2021-137554, filed on Aug. 25, 2021, the entire contents of which are incorporated herein by reference.

BACKGROUND OF THE INVENTION

1. Field of the Invention

The embodiments discussed herein relate to a semiconductor device and a method of manufacturing a semiconductor device.

2. Background of the Related Art

There is a known problem with semiconductor devices in that when chips are mounted on a substrate, the substrate may warp to become upwardly convex when the chip mounting surface side is regarded as the "upper surface" due to thermal stress caused by differences in the coefficient of thermal expansion between the chips and the substrate (see Japanese Patent No. 5,576,528).

Various technologies have been proposed for semiconductor devices that are susceptible to deformation such as warping.

As one example, one known technology screws a semiconductor module, which includes a semiconductor assembly encapsulated in resin inside a case with the bottom exposed, onto a cooler via a thermally conductive sheet, and provides recesses at predetermined positions in the thermally conductive sheet (see Japanese Patent No. 6,849,137).

Another known technology has tubular members provided in encapsulating resin that encapsulates an insulated circuit board, on which a semiconductor chip is mounted, so as to expose one surface of the circuit board. Screws are inserted into the through holes inside the tubular members to attach a cooler or the like provided on the exposed side of the insulated circuit board (see Japanese Laid-open Patent Publication No. 2019-201114).

Also known are a technology that sticks an outer wall portion of a case to an insulated substrate on which a semiconductor element has been fixed, passes screws through through-holes provided in the outer wall portion, and tightens the screws into screw holes in a cure base plate or the like, and a technology that provides a retaining portion, which contacts and presses down the insulated substrate, on an extension provided so as to connect two inner walls of the case (see Japanese Laid-open Patent Publication No. 2015-216349).

Another known technology joins beam leads to a power semiconductor element to be mounted on an insulated substrate disposed via a coated layer of a thermally conductive material inside a frame on top of a cooler. The beam leads are biased in a direction that presses the coated layer using a biasing member in the form of a leaf spring that is fixed to the frame (see Japanese Laid-open Patent Publication No. 2016-134552).

There is also a known technology that encapsulates an insulated substrate, a semiconductor element provided on the insulated substrate, and internal terminals connected to the semiconductor element with an encapsulating material so that a rear surface of the insulated substrate and ends of the internal terminals are exposed, covers the encapsulating material with a case, and connects the case and the ends of the internal terminals using elastic members (see Japanese Laid-open Patent Publication No. 2019-36677).

In another known technology, a partition plate is provided inside a resin case that is bonded to a peripheral edge of an insulated substrate so as to house the insulated substrate and semiconductor elements mounted on the insulated substrate. Encapsulating material is separately provided in each of the sections formed by the partition plate (see Japanese Laid-open Patent Publication No. 2016-96188).

In another known technology, a pair of insulated substrates on which semiconductor elements are mounted are disposed with a certain spacing on a cooler. A beam portion positioned between the pair of insulated substrates is provided on a case that is fixed to the peripheral edge of the cooler, and a pressing force is applied to the cooler by the tips of male screws that pass through the beam portion (see Japanese Laid-open Patent Publication No. 2006-66427).

Another known technology has holes provided in an insulated circuit board to which semiconductor chips are bonded and inserts screws through the holes to fasten the insulated circuit board to a cooler (see Japanese Laid-open Patent Publication No. 2004-288828).

In another known technology, a beam portion is provided on a case that houses an insulated substrate with a conductive pattern to which a semiconductor chip is fixed so that one surface of the substrate is exposed. The tips of column-shaped stoppers provided on the beam portion are attached to mounting holes of a cooler attached onto the case so as to contact the insulated substrate (see International Publication Pamphlet No. WO 2014/013883 A1)

As a semiconductor device where an insulated substrate, which has conductive patterns provided on both main surfaces, and semiconductor elements mounted on one of the main surfaces are housed in a case housing, one known structure has the other main surface of the insulated substrate exposed from the case housing. As one example, a semiconductor device with this structure is used with a cooler provided via a thermal interface material (hereinafter, "TIM"), such as thermal grease, on the main surface side of the insulated substrate that is exposed from the case housing.

However, an insulated substrate on which semiconductor elements are mounted is susceptible to deformation, such as warping, due to differences in thermal expansion coefficient between the semiconductor elements and the insulated substrate. This warping may occur during heat treatments performed during the manufacturing process of the semiconductor device and/or during operations of the semiconductor elements that generate heat. When deformation has occurred for the insulating board, during installation of a cooler via a TIM on the main surface side of the insulated substrate that is exposed from the case housing, there is the risk of relatively large gaps being produced between the insulated substrate and the cooler, or a void being produced between the insulated substrate and the cooler. When a relatively large gap or a void is produced between the insulated substrate and the cooler, there will be an increase in thermal resistance between the insulated substrate and the cooler. As a result, the insulated substrate and the semiconductor elements mounted on the insulated substrate may overheat. Due to this overheating, there is the risk of deterioration in performance or breakage of the semiconductor elements, resulting in a drop in performance and quality of a semiconductor device including semiconductor elements.

SUMMARY OF THE INVENTION

According to an aspect, there is provided a semiconductor device including: an insulated substrate; a semiconductor element that is mounted on a first main surface side of the insulated substrate; a case housing that houses the insulated substrate and the semiconductor element so as to expose a second main surface side of the insulated substrate that is opposite to the first main surface side of the insulated substrate, the case being bonded to an outer circumferential portion of the insulated substrate, and having a first screw hole facing the first main surface side of the insulated substrate; and a screw that is screwed into the first screw hole of the case housing and has a tip portion that contacts the first main surface side of the insulated substrate.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1A:
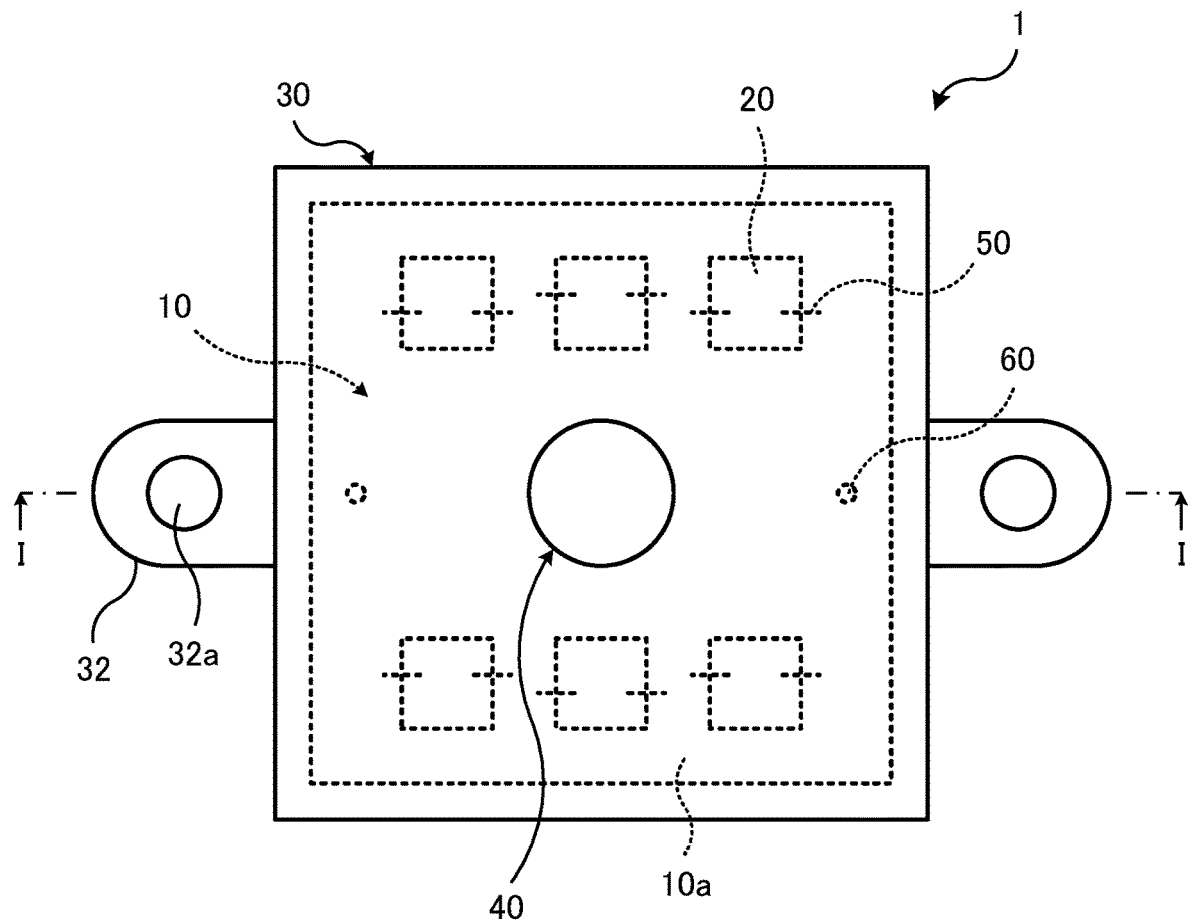
FIGS. 1A and 1B depict one example of a semiconductor device according to a first embodiment.
Figure 1B:
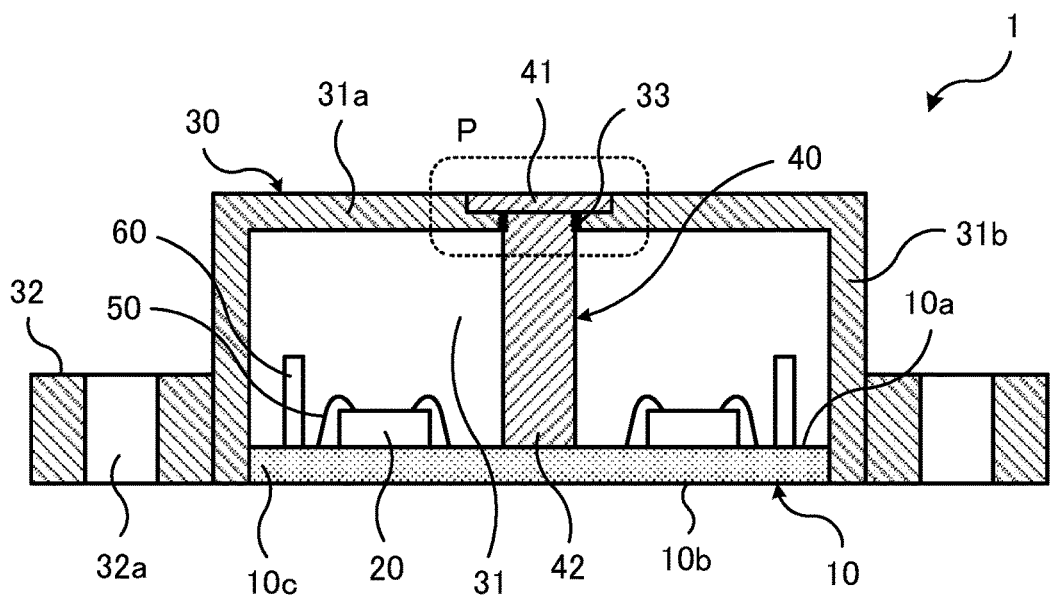

FIGS. 1A and 1B depict one example of a semiconductor device according to a first embodiment. FIG. 1A is a schematic plan view of a principal part of one example of a semiconductor device according to the first embodiment and FIG. 1B is a schematic cross-sectional view taken along a line I-I in FIG. 1A.

The semiconductor device 1 depicted in FIGS. 1A and 1B is one example of a power semiconductor module used for converting power in an electric vehicle, an electric train, a machine tool, a home appliance, or the like. The semiconductor device 1 depicted in FIGS. 1A and 1B includes an insulated substrate 10, semiconductor elements 20, a case housing 30, and a screw 40.

As one example, the insulated substrate 10 uses a ceramic substrate that has conductive layers provided in predetermined patterns on both main surfaces. As examples of the ceramic substrate, a substrate using alumina, a composite ceramic containing alumina as a main component, aluminum nitride, silicon nitride, or the like is used. The thickness of the ceramic substrate is at least 0.2 mm but not greater than 1.5 mm, and as one example is 0.3 mm. A metal such as copper or aluminum is used for the conductive layers. The thickness of the conductive layers is at least 0.2 mm but not greater than 1.0 mm, and as one example is 0.25 mm. As the insulated substrate 10, it is possible to use a direct copper bonding (DCB) substrate, an active metal brazed (AMB) substrate, or the like.

At least one semiconductor element 20 (here, in the illustrated example, six semiconductor elements 20) is mounted on one main surface 10a side of the insulated substrate 10.

Each semiconductor element 20 is electrically connected to the conductive layer provided on the main surface 10a side of the insulated substrate 10. As one example, each semiconductor element 20 is mounted via a bonding material, such as solder, onto part of the conductive layer provided on the main surface 10a side of the insulated substrate 10 and is connected via wires 50 to other parts of the conductive layer provided on the main surface 10a side. In addition to the semiconductor elements 20, the insulated substrate 10 has terminal components 60, which are electrically connected to the semiconductor elements 20, mounted on the conductive layer provided on the main surface 10a side of the insulated substrate 10.

As examples, semiconductor elements such as insulated gate bipolar transistors (IGBTs) or metal oxide semiconductor field effect transistors (MOSFETs) are used as the semiconductor elements 20. It is also possible to use diodes such as free wheeling diodes (FWDs) or Schottky barrier diodes (SBDs) as the semiconductor elements 20. It is also possible to use packages where these diodes are integrated with an IGBT or a MOSFET. The insulated substrate 10 and the semiconductor elements 20 mounted on the insulated substrate 10 are used to form a circuit with a predetermined function, such as a power conversion circuit or an inverter circuit.

A resin such as polyphenylene sulfide (PPS) resin, polybutylene terephthalate (PBT) resin, or liquid crystal polymer (LCP) resin is used for the case housing 30. The case housing 30 houses the insulated substrate 10 and the semiconductor elements 20 mounted on the insulated substrate 10. The insulated substrate 10 and the semiconductor elements 20 are housed in the case housing 30 so that the main surface 10b side of the insulated substrate 10, that is, the opposite surface to the main surface 10a on which the semiconductor elements 20 are mounted, is exposed.

The case housing 30 has an internal space 31 surrounded by a top plate 31a and a side wall 31b that is continuous with the top plate 31a, and fixing portions 32 that connect the case housing 30 to other components, such as a cooler, described later. The insulated substrate 10 and the semiconductor elements 20 are housed in the internal space 31 of the case housing 30 so that the main surface 10b of the insulated substrate 10 is exposed. The insulated substrate 10 on which the semiconductor elements 20 are mounted is fixed to the case housing 30 by bonding an outer circumferential portion 10c of the insulated substrate 10 to an inner surface side of the side wall 31b of the case housing 30 using silicone adhesive or the like. The case housing 30 may be fixed to other components by inserting screws or the like through fixing holes 32a provided in the fixing portions 32.

The semiconductor device 1 is configured so that before connection to another component such as a cooler, the main surface 10b side of the package with built-in electronic components 10 that is housed together with the semiconductor elements 20 inside the case housing 30, that is, the opposite surface to the main surface 10a side where the semiconductor elements 20 are mounted, is exposed from the case housing 30. The semiconductor device 1 is one example of a semiconductor device that uses a so-called "baseless structure" where a base plate, such as a metal plate, that dissipates heat is not provided on the main surface 10b side of the insulated substrate 10 housed in the case housing 30. A baseless structure is effective in achieving a compact and lightweight semiconductor device 1.

The case housing 30 of the semiconductor device 1 is provided with a screw hole 33 (or cap head screw portion) in a part that faces the main surface 10a side of the insulated substrate 10 to be housed, that is, in part of the top plate 31a. As one example, the screw hole 33 is integrally molded with the case housing 30 during injection molding of the case housing 30. Also as one example, the screw hole 33 is provided in a part that faces a center portion on the main surface 10a side of the insulated substrate 10. The screw 40 is screwed through the screw hole 33 provided in the case housing 30 so that the screw 40 extends into the internal space 31. A material such as resin, metal, or ceramics is used for the screw 40. As examples, the screw 40 may use a resin such as polypropylene, a metal such as copper or iron, or a ceramic such as alumina or zirconia. The diameter of the screw 40 may be 20 mm or less, for example.

Figure 2:
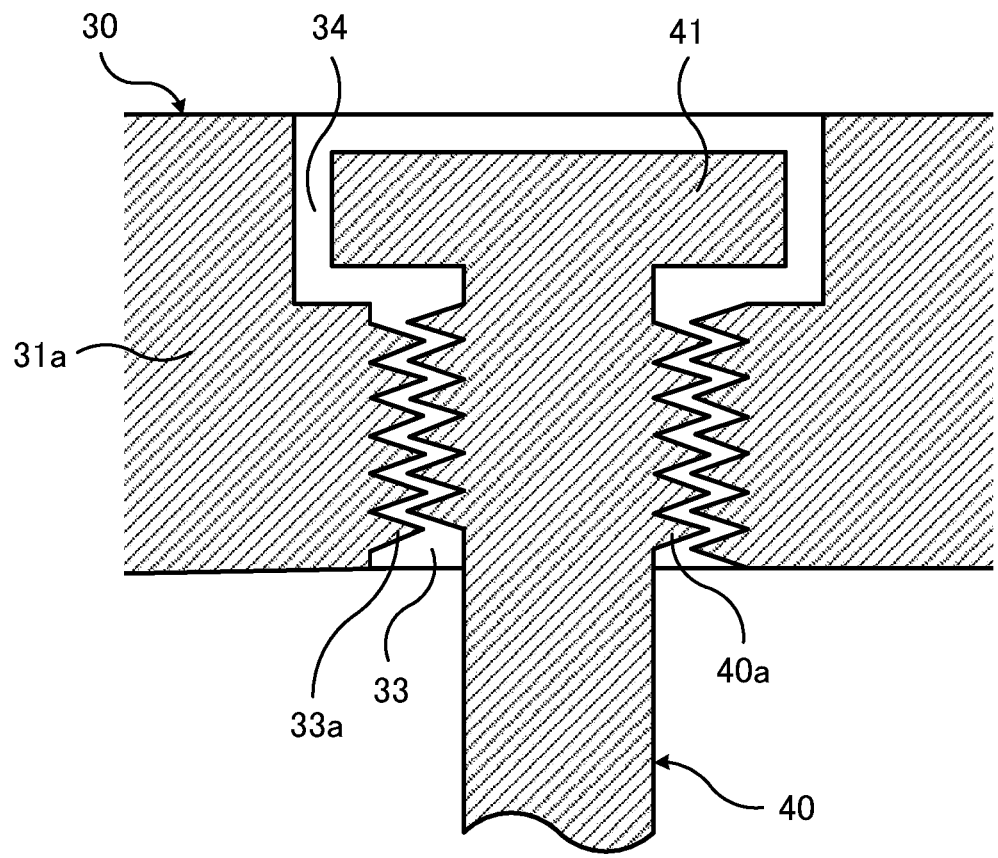
FIG. 2 depicts an example of how a case housing and a screw are screwed together according to the first embodiment.

FIG. 2 depicts an example of how the case housing and the screw are screwed together according to the first embodiment. FIG. 2 is a schematic enlargement of a part labeled "P" in FIG. 1B.

As one example, as depicted in FIG. 2, the screw hole 33 that has a (female) screw thread 33a formed inside is provided in a part of the case housing 30 that faces the main surface 10a side of the insulated substrate 10. The screw 40 that has a (male) screw thread 40a with a thread pitch that matches the screw thread 33a is screwed into the screw hole 33 of the case housing 30. As one example, as depicted in FIG. 2, a head 41 of the screw 40 is designed to fit inside a recess 34 that communicates with and has a larger diameter than the screw hole 33 when the screw 40 is screwed sufficiently deeply into the screw hole 33.

As depicted in FIG. 1B, the depth to which the screw 40 is screwed into the screw hole 33 of the case housing 30 is adjusted so that a tip portion 42 contacts the main surface 10a side of the insulated substrate 10. The tip portion 42 of the screw 40 contacts a region on the main surface 10a side of the insulated substrate 10 where no semiconductor element 20 is mounted.

With the semiconductor device 1, by screwing the screw 40 into the screw hole 33 of the case housing 30, placing the tip portion 42 of the screw 40 into contact with the main surface 10a of the insulated substrate 10, and further adjusting the screwed-in depth of the screw 40, it is possible to adjust deformation of the insulated substrate 10. This will now be described in detail with reference to FIGS. 3A and 3B.

Figure 3A:
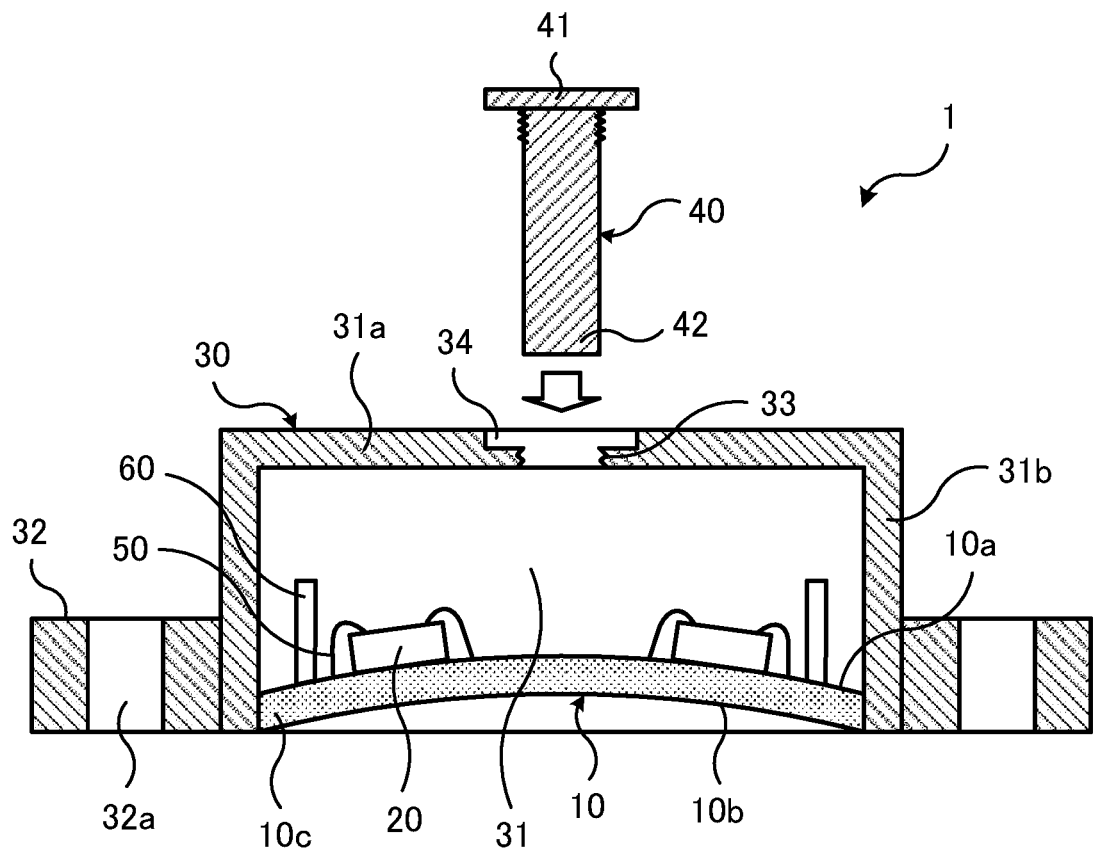
FIGS. 3A and 3B depict an example method of assembling the semiconductor device according to the first embodiment.
Figure 3B:
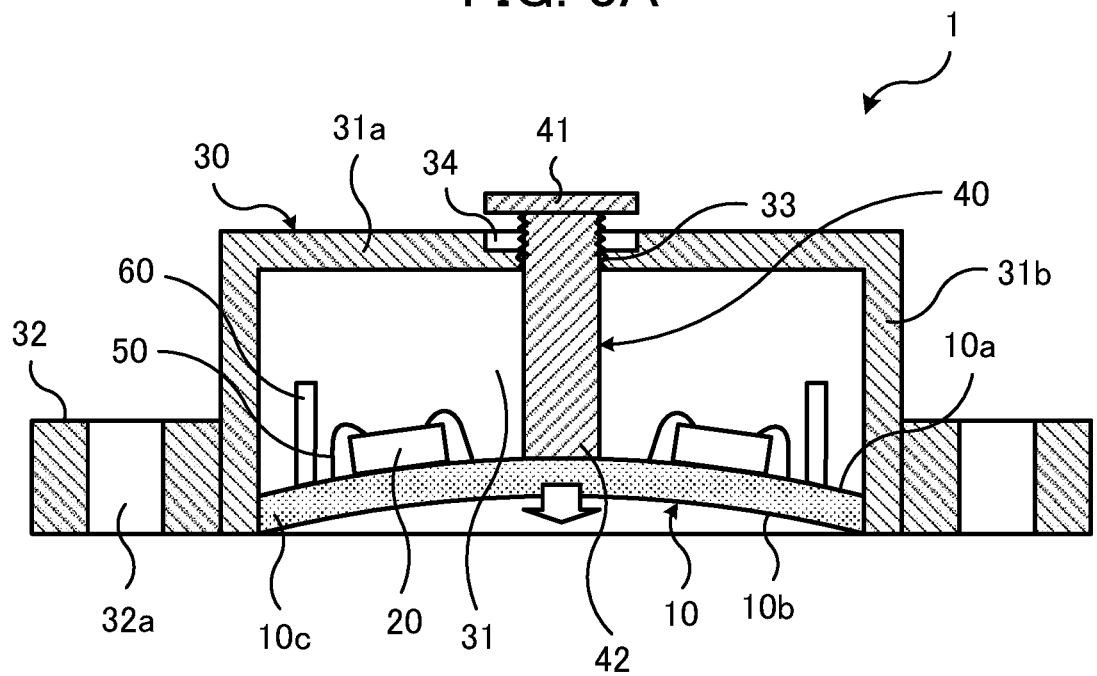

FIGS. 3A and 3B depict an example method of assembling a semiconductor device according to the first embodiment. FIG. 3A is a schematic cross-sectional view of a principal part of an example configuration in a state before the screw is screwed in during assembly of the semiconductor device according to the first embodiment. FIG. 3B is a schematic cross-sectional view of a principal part of an example configuration in a state during screwing in of the screw during assembly of the semiconductor device according to the first embodiment.

As one example, as depicted in FIG. 3A, consider a situation where the insulated substrate 10 that is housed in the case housing 30 with the outer circumferential portion 10c bonded to the side wall 31b of the case housing 30 is warped so that the central portion thereof is convexly bent toward the main surface 10a side (hereinafter, this state is referred to as "convex warping"). The insulated substrate 10 has a tendency for convex warping due to the difference in thermal expansion coefficients between the insulated substrate 10 and the semiconductor elements 20 mounted on the main surface 10a side. For a baseless structure where, like the semiconductor device 1, the main surface 10b side of the insulated substrate 10 is exposed from the case housing 30, convex warping like this tends to occur for the insulated substrate 10 since a base plate is not connected to the main surface 10b side.

When convex warping has occurred for the insulated substrate 10 housed in the case housing 30, in the semiconductor device 1, the screw 40 is inserted into the screw hole 33 of the case housing 30 as depicted in FIG. 3A. The screw 40 is then screwed into the screw hole 33 of the case housing 30. When the screw 40 has been inserted and screwed into the screw hole 33 of the case housing 30, as depicted in FIG. 3B, the tip portion 42 will come into contact with the main surface 10a side of the insulated substrate 10 for which convex warping has occurred. By further screwing the screw 40 into the screw hole 33 of the case housing 30 in a state where the tip portion 42 is in contact with the main surface 10a side of the insulated substrate 10, the insulated substrate 10 is pressed by the tip portion 42 of the screw 40 being pressed into the case housing 30 by the screwing operation and becomes deformed in a direction (indicated by the wide arrow in FIG. 3B) that corrects the convex warping.

By adjusting the screwed-in depth of the screw 40 (that is, the pressing of the screw 40), deformation of the insulated substrate 10 is adjusted. As one example, by adjusting the screwed-in depth of the screw 40, the insulated substrate 10 is adjusted to have a flat shape where the convex warping is eliminated or to have a shape that is close to flat with reduced convex warping. By doing so, as one example, when a cooler is connected to the exposed main surface 10b side of the insulated substrate 10 via a TIM as described later, it is possible to reduce the gap between the main surface 10b of the insulated substrate 10 and the cooler, which reduces thermal resistance between the insulated substrate 10 and the cooler.

Note that it does not need to adjust the screwed-in depth of the screw 40 as described above so as to adjust the insulated substrate 10 to become a flat shape where the convex warping is eliminated. As one example, in accordance with the form (that is, the unevenness or the like) of the connecting surface of another component, such as a cooler, to be connected to the main surface 10b side of the insulated substrate 10, it is also possible to adjust the insulated substrate 10 to have a shape where a certain amount of convex warping remains or to adjust the insulated substrate 10 to produce a shape with warping (hereinafter referred to as "concave warping") that is convex toward the main surface 10b side.

In the semiconductor device 1, the semiconductor elements 20 generate heat during operation. As one example, the semiconductor elements 20 generate heat due to switching operations of transistors included in the semiconductor elements 20. Due to the heat generated by operations of the semiconductor elements 20 and repeated production of heat that accompanies switching operations, a force that causes convex warping on the main surface 10a side may act on the insulated substrate 10. On the other hand, with the semiconductor device 1, since the tip portion 42 of the screw 40 screwed into the screw hole 33 of the case housing 30 contacts the main surface 10a side of the insulated substrate 10, deformation of the insulated substrate 10 toward the main surface 10a side due to the generation of heat by the semiconductor elements 20 is restricted. As a result, as described later, it is possible to avoid an example situation where the gap between the insulated substrate 10 and the cooler connected via a TIM to the exposed main surface 10b side fluctuates in keeping with operations of the semiconductor elements 20, which would cause fluctuations in thermal resistance between the insulated substrate 10 and the cooler.

In the past, a method of adjusting the thickness of the conductive layers provided on both main surfaces of the ceramic substrate that is the insulated substrate 10 to suppress or control warping that occurs for the insulated substrate 10 was also proposed. However, the thickness of conductive layers on the insulated substrate 10 is set by standards, and it is not always easy to acquire insulated substrates 10 where the conductive layers have the desired thickness. Even when suitable insulated substrates 10 are available, the use of a special specification may increase cost and there have been cases where warping could not be suppressed or controlled as desired.

With the semiconductor device 1, by providing the screw hole 33 in the case housing 30, screwing the screw 40 into the screw hole 33, placing the tip portion 42 of the screw 40 into contact with the insulated substrate 10, and adjusting the screwed-in depth, it is possible to adjust the deformation of the insulated substrate 10. With the semiconductor device 1, it is possible to adjust the screwed-in depth of the screw 40 to adjust the deformation of the insulated substrate 10 in accordance with the warping of the insulated substrate 10, the shape of an attached component, such as a cooler, to be connected to the insulated substrate 10, and the like regardless of how the insulated substrate 10 is configured.

The semiconductor device 1 with the above configuration will now be described further.

First, contacting portions of the insulated substrate 10 of the semiconductor device 1 and the screw 40 will be described.

Figure 4A:
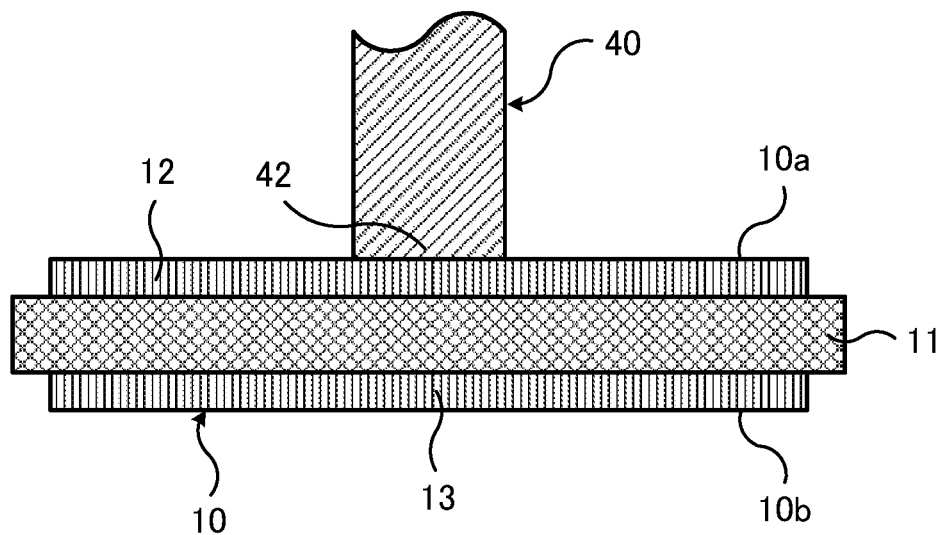
FIGS. 4A and 4B depict contacting portions of an insulated substrate and the screw of the semiconductor device according to the first embodiment.
Figure 4B:
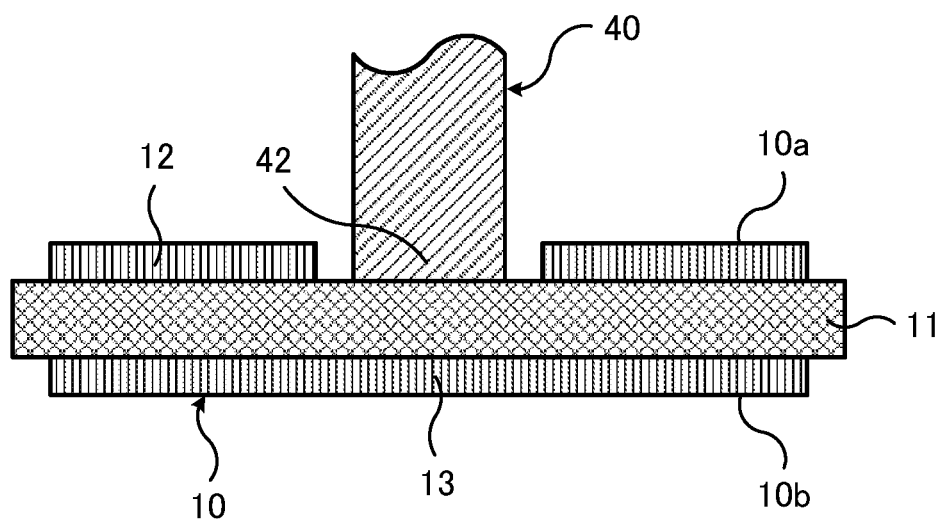

FIGS. 4A and 4B depict contacting portions of the insulated substrate and the screw of the semiconductor device according to the first embodiment. FIGS. 4A and 4B are schematic cross-sectional views of principal parts of example configurations of the contacting portions of the insulated substrate and the screw of a semiconductor device according to the first embodiment.

As the insulated substrate 10 of the semiconductor device 1, as one example, a configuration like that described earlier and depicted in FIGS. 4A and 4B with a ceramic substrate 11 of alumina or the like and a conductive layer 12 and a conductive layer 13 of copper or the like provided on the two main surfaces of the ceramic substrate 11 is used.

With the semiconductor device 1, as one example, as depicted in FIG. 4A, the tip portion 42 of the screw 40, which has been screwed into the screw hole 33 of the case housing 30 and contacts the main surface 10a side of the insulated substrate 10, contacts part of the conductive layer 12 provided on the ceramic substrate 11 of the insulated substrate 10. Alternatively, with the semiconductor device 1, as another example, as depicted in FIG. 4B, the tip portion 42 of the screw 40, which has been screwed into the screw hole 33 of the case housing 30 and contacts the main surface 10a side of the insulated substrate 10, contacts part of the ceramic substrate 11 of the insulated substrate 10 that is exposed from the conductive layer 12.

As depicted in FIG. 4A, when the tip portion 42 of the screw 40 is placed in contact with the conductive layer 12, which uses a comparatively soft material such as copper, on the insulated substrate 10, it is possible to suppress the concentration of stress in the insulated substrate 10 that accompanies the pressing caused by the screwing in of the screw 40, and in turn to suppress breakage of the insulated substrate 10. When concentration of stress in the insulated substrate 10 due to the pressing caused by the screwing in the screw 40 and breakage of the insulated substrate 10 due to this are unlikely, as depicted in FIG. 4B, the tip portion 42 of the screw 40 may be brought into contact with the ceramic substrate 11 of the insulated substrate 10 which uses a comparatively hard material such as alumina. By doing so, it is possible to suppress sinking of the conductive layer 12 due to the pressing caused by the screwing in of the screw 40 when the tip portion 42 of the screw 40 is placed in contact with the conductive layer 12 and displacement of the insulated substrate 10 due to this sinking of the conductive layer 12.

Next, resin encapsulation of the semiconductor device 1 will be described.

Figure 5A:
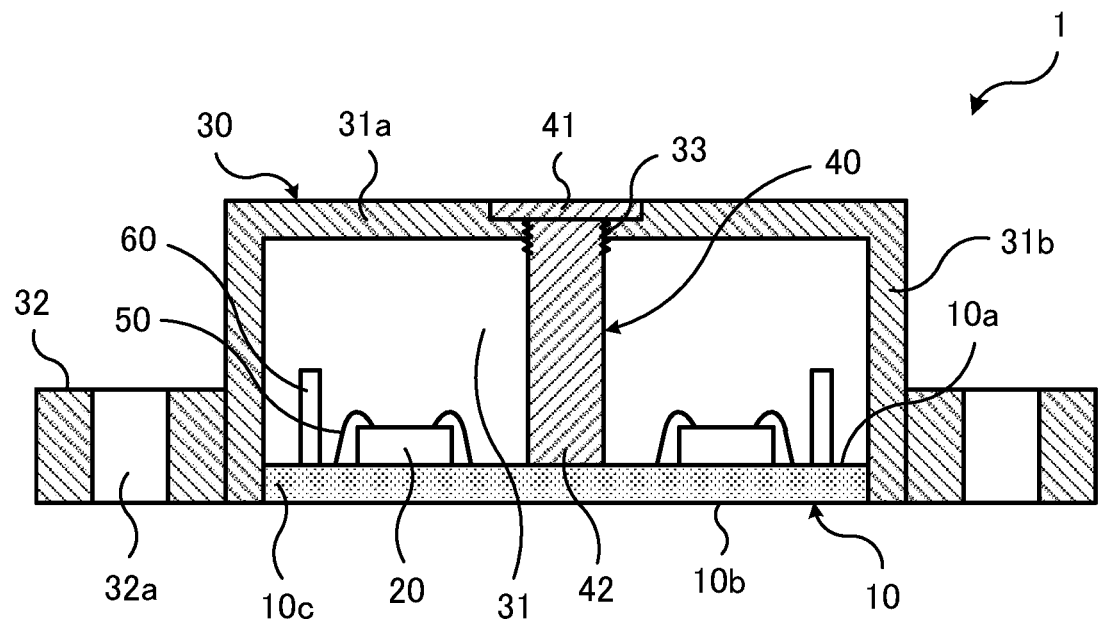
FIGS. 5A and 5B depict a first example of resin encapsulation of the semiconductor device according to the first embodiment.
Figure 5B:
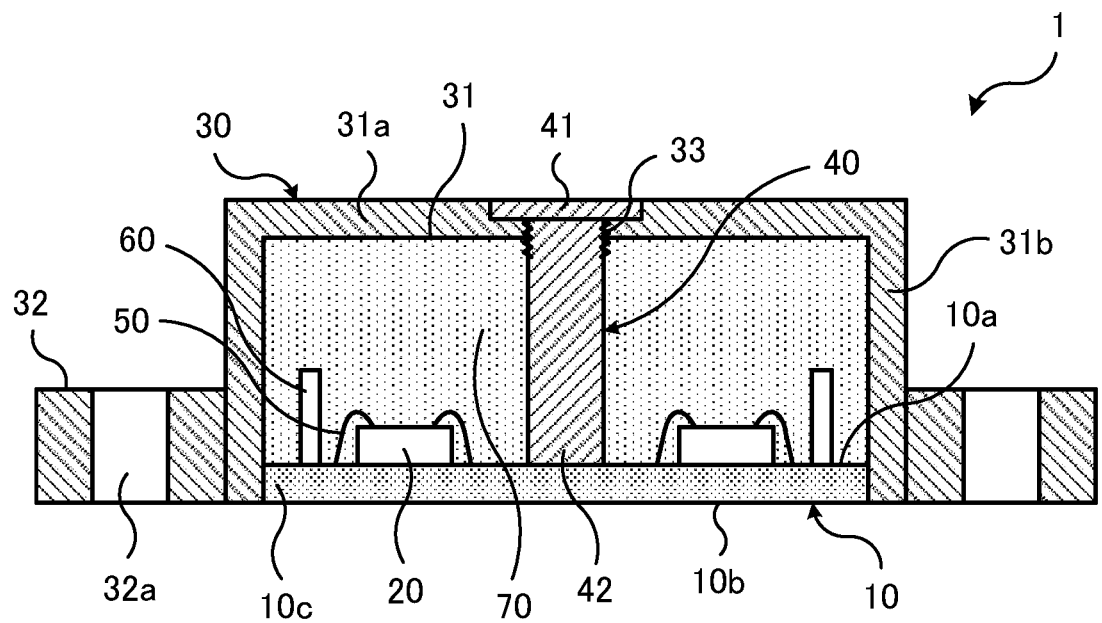

FIGS. 5A and 5B depict a first example of resin encapsulation of the semiconductor device according to the first embodiment. FIG. 5A is a schematic cross-sectional view of a principal part of one example of a deformation adjusting step for a first example of an insulated substrate. FIG. 5B is a schematic cross-sectional view of a principal part of one example of a resin encapsulation step for this first example.

In the semiconductor device 1, it is possible to fill the internal space 31 of the case housing 30, which houses the insulated substrate 10 on which the semiconductor elements 20 are mounted, with encapsulating resin 70.

When the internal space 31 of the case housing 30 is to be filled with the encapsulating resin 70, as one example, first, as depicted in FIG. 5A, deformation of the insulated substrate 10 is adjusted according to the example described above with reference to FIGS. 3A and 3B. That is, deformation of the insulated substrate 10 is adjusted by inserting and screwing the screw 40 into the screw hole 33 of the case housing 30, placing the tip portion 42 of the screw 40 into contact with the main surface 10a side of the insulated substrate 10, and further adjusting the depth by which the screw 40 is screwed into the screw hole 33.

After deformation of the insulated substrate 10 has been adjusted by the screw 40 in this way, the internal space 31 of the case housing 30 is filled with the encapsulating resin 70 as depicted in FIG. 5B. A resin material such as epoxy resin or silicone resin is used for the encapsulating resin 70. One type of resin material may be used as the encapsulating resin 70, but it is also possible to use two or more resin materials. It is also possible to use a resin material containing an insulating filler in the form of particles or fibers as the encapsulating resin 70. After the internal space 31 of the case housing 30 has been filled, the encapsulating resin 70 is cured by a suitable curing method for the material being used. The semiconductor elements 20 mounted on the main surface 10a side of the insulated substrate 10 and the wires 50 and the terminal components 60 connected to the semiconductor elements 20 all become encapsulated by the encapsulating resin 70 that fills the internal space 31 of the case housing 30.

As one example, a semiconductor device 1 where the case housing 30 that houses the insulated substrate 10 on which the semiconductor elements 20 are mounted has been filled with the encapsulating resin 70 is obtained using a method like that depicted in FIGS. 5A and 5B.

Figure 6A:
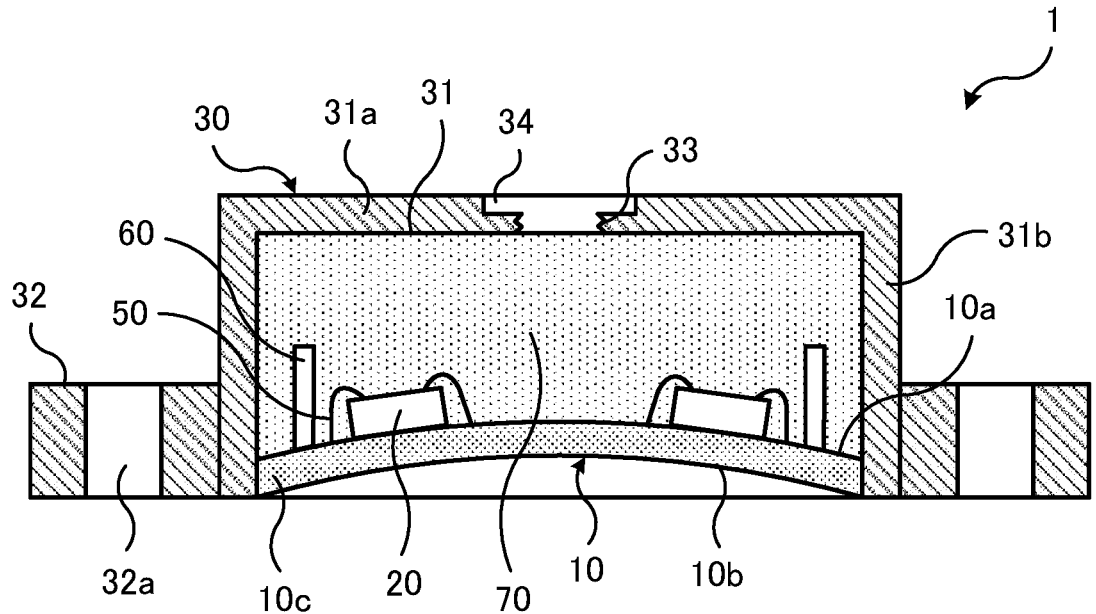
FIGS. 6A and 6B depict a second example of resin encapsulation of the semiconductor device according to the first embodiment.
Figure 6B:
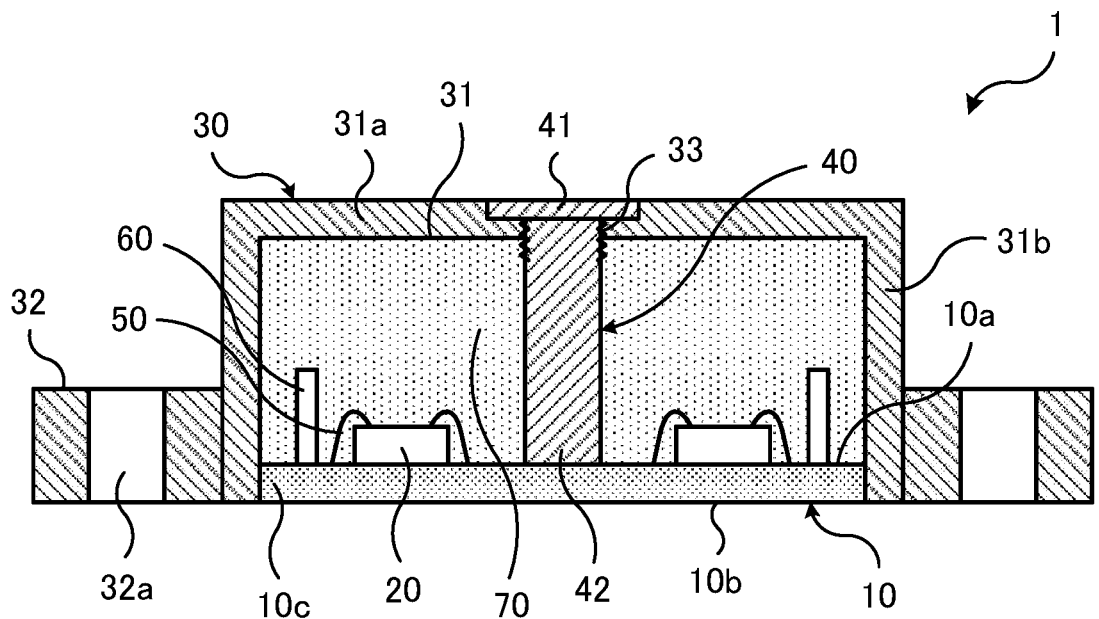

FIGS. 6A and 6B depict a second example of resin encapsulation of the semiconductor device according to the first embodiment. FIG. 6A is a schematic cross-sectional view of a principal part of one example of a resin encapsulation process for this second example. FIG. 6B is a schematic cross-sectional view of a principal part of one example of a deformation adjusting step for an insulated substrate for this second example.

When filling the internal space 31 of the case housing 30 with the encapsulating resin 70, it is possible to use the method depicted in FIGS. 6A and 6B, for example.

First, as depicted in FIG. 6A, the internal space 31 of the case housing 30 that houses the insulated substrate 10 on which the semiconductor elements 20 has been mounted and which has deformed is filled with the encapsulating resin 70. As the encapsulating resin 70 used in this case, a resin material that is soft or deformable, such as silicone resin, is used. One type of resin material may be used as the encapsulating resin 70, but it is also possible to use two or more resin materials. It is also possible to use a resin material containing an insulating filler in the form of particles or fibers as the encapsulating resin 70. The semiconductor elements 20 mounted on the main surface 10a side of the insulated substrate 10 and the wires 50 and the terminal components 60 connected to the semiconductor elements 20 all become encapsulated by the encapsulating resin 70 that fills the internal space 31 of the case housing 30.

After the internal space 31 of the case housing 30 has been filled with the encapsulating resin 70 in this way, as depicted in FIG. 6B, the deformation of the insulated substrate 10 is adjusted according to the example described above with reference to FIGS. 3A and 3B. That is, deformation of the insulated substrate 10 is adjusted by inserting and screwing the screw 40 into the screw hole 33 of the case housing 30 so as to push back the encapsulating resin 70, placing the tip portion 42 of the screw 40 into contact with the main surface 10a side of the insulated substrate 10, and further adjusting the depth by which the screw 40 is screwed into the screw hole 33. The encapsulating resin 70 is cured by a suitable curing method for the material of the encapsulating resin 70 before or after adjustment of the deformation of the insulated substrate 10.

As one example, a semiconductor device 1 where the case housing 30 that houses the insulated substrate 10 on which the semiconductor elements 20 are mounted has been filled with the encapsulating resin 70 is obtained using a method like that depicted in FIGS. 6A and 6B.

Next, connecting the semiconductor device 1 to a cooler will be described.

Figure 7A:
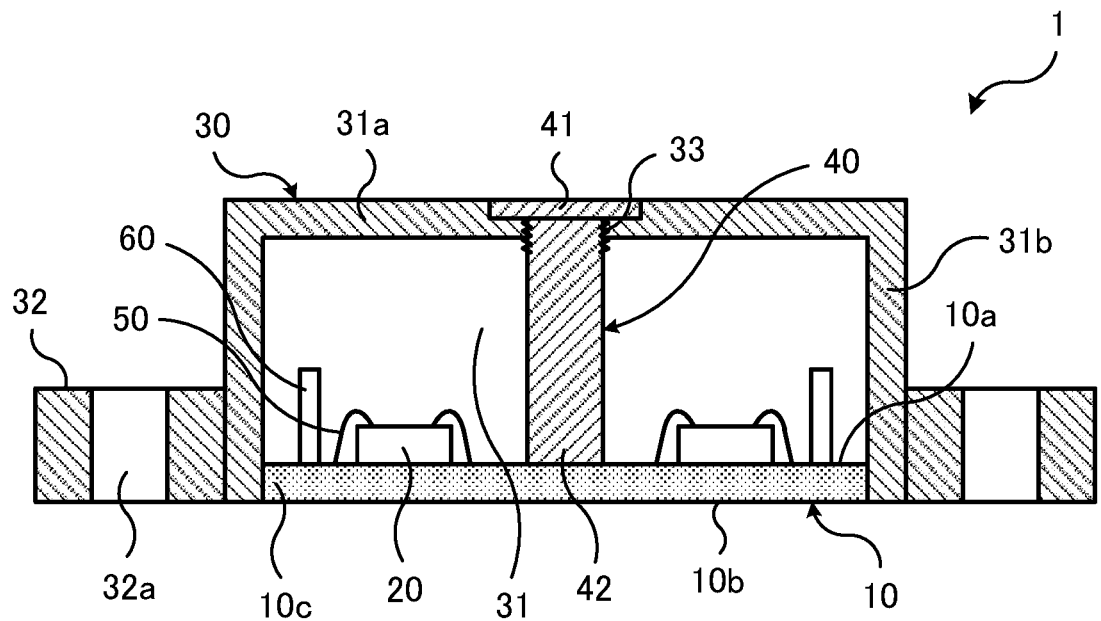
FIGS. 7A and 7B depict a first example of connecting the semiconductor device according to the first embodiment to a cooler.
Figure 7B:
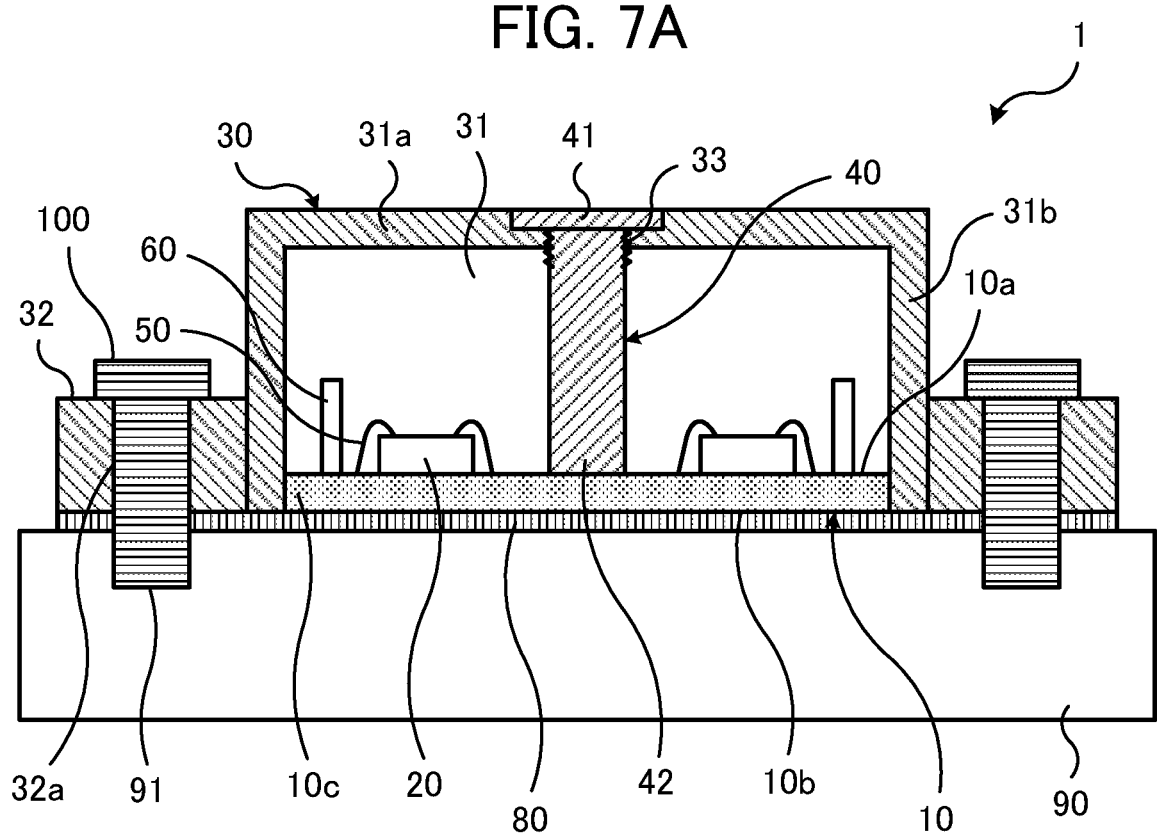

FIGS. 7A and 7B depict a first example of connecting the semiconductor device according to the first embodiment to a cooler. FIG. 7A is a schematic cross-sectional view of a principal part of one example of the deformation adjusting step for an insulated substrate for this first example. FIG. 7B is a schematic cross-sectional view of a principal part of one example of a cooler connecting step for this first example.

It is possible to connect a cooler 90 via a TIM 80, such as thermal grease or a thermal sheet, to the main surface 10b side, which is exposed from the case housing 30, of the insulated substrate 10 that has the semiconductor elements 20 mounted on the main surface 10a side and is housed in the case housing 30.

When connecting the cooler 90 via the TIM 80 to the main surface 10b side of the insulated substrate 10, as one example, first, as depicted in FIG. 7A, deformation of the insulated substrate 10 is adjusted in accordance with the example described with reference to FIGS. 3A and 3B. That is, deformation of the insulated substrate 10 is adjusted by inserting and screwing the screw 40 into the screw hole 33 of the case housing 30, placing the tip portion 42 of the screw 40 into contact with the main surface 10a side of the insulated substrate 10, and further adjusting the screwed-in depth of the screw 40 into the screw hole 33.

After the deformation of the insulated substrate 10 has been adjusted by the screw 40 in this way, as depicted in FIG. 7B, the cooler 90 is connected via the TIM 80, such as thermal grease or a thermal sheet, to the main surface 10b side of the insulated substrate 10. As one example, the cooler 90 is equipped with screw holes 91 corresponding to the fixing holes 32a provided in the fixing portions 32 of the case housing 30. The case housing 30 is connected to and fixed to the cooler 90 by inserting screws 100 into the fixing holes 32a of the case housing 30 and screwing the screws 100 into the screw holes 91 of the cooler 90.

As one example, using the method depicted in FIGS. 7A and 7B, the semiconductor device 1 is obtained where the cooler 90 is connected, via the TIM 80, to the main surface 10b side, which is exposed from the case housing 30, of the insulated substrate 10 that has the semiconductor elements 20 mounted on the main surface 10a side and is housed in the case housing 30.

In the method depicted in FIGS. 7A and 7B, the cooler 90 is connected via the TIM 80 to the main surface 10b side of the insulated substrate 10 whose deformation has been adjusted by the screw 40. With the method depicted in FIGS. 7A and 7B, it is possible to suppress the formation of large gaps at different locations between the main surface 10b of the insulated substrate 10 and the cooler 90, and/or the formation of voids that are not entirely filled with the TIM 80. This means that it is possible to prevent increases in thermal resistance between the insulated substrate 10 and the cooler 90. As a result, heat dissipation from the insulated substrate 10, on which the semiconductor elements 20 that generate heat during operations are mounted, to the cooler 90 is enhanced, which prevents overheating of the semiconductor elements 20 and deterioration in performance or breakage of the semiconductor elements 20 due to overheating.

Note that for the method depicted in FIGS. 7A and 7B, the case housing 30 may be filled with the encapsulating resin 70 according to the example in FIGS. 5A and 5B or in FIGS. 6A and 6B before the case housing 30 is connected to the cooler 90. Alternatively, the case housing 30 may be filled with the encapsulating resin 70 after the cooler 90 has been connected.

Figure 8A:
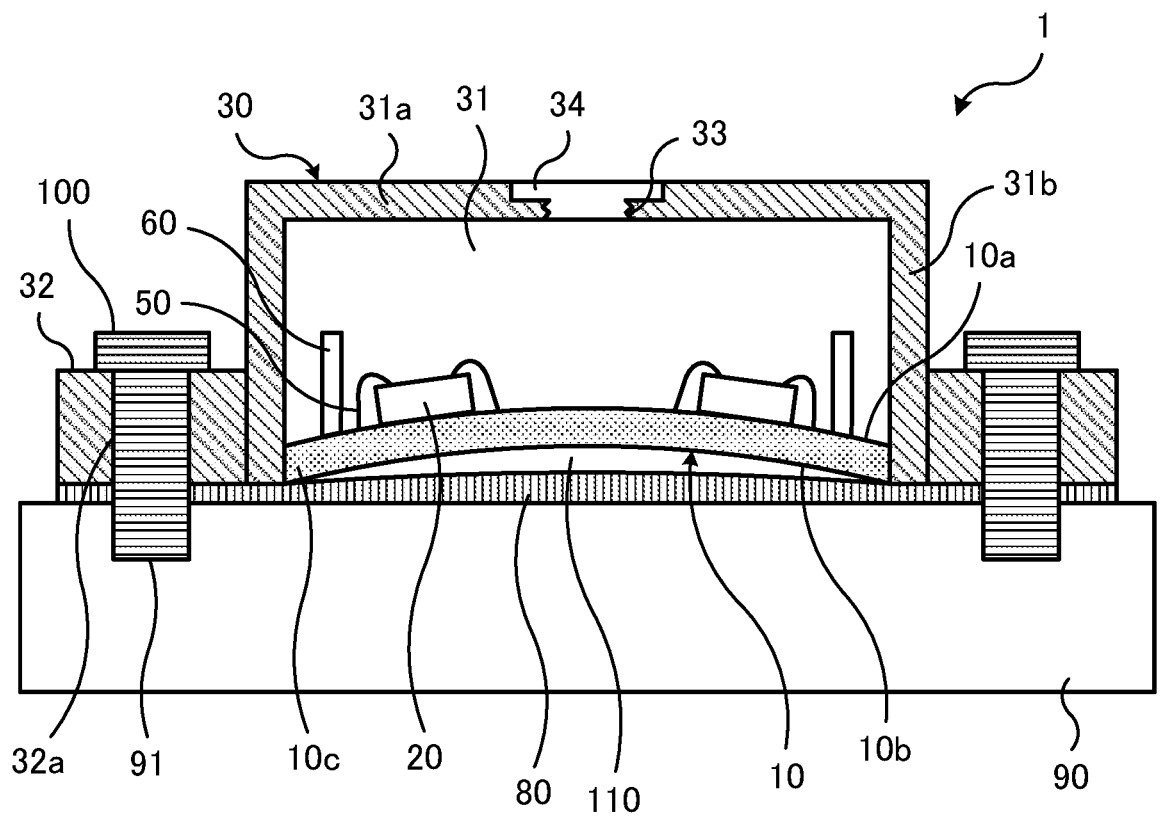
FIGS. 8A and 8B depict a second example of connecting the semiconductor device according to the first embodiment to a cooler.
Figure 8B:
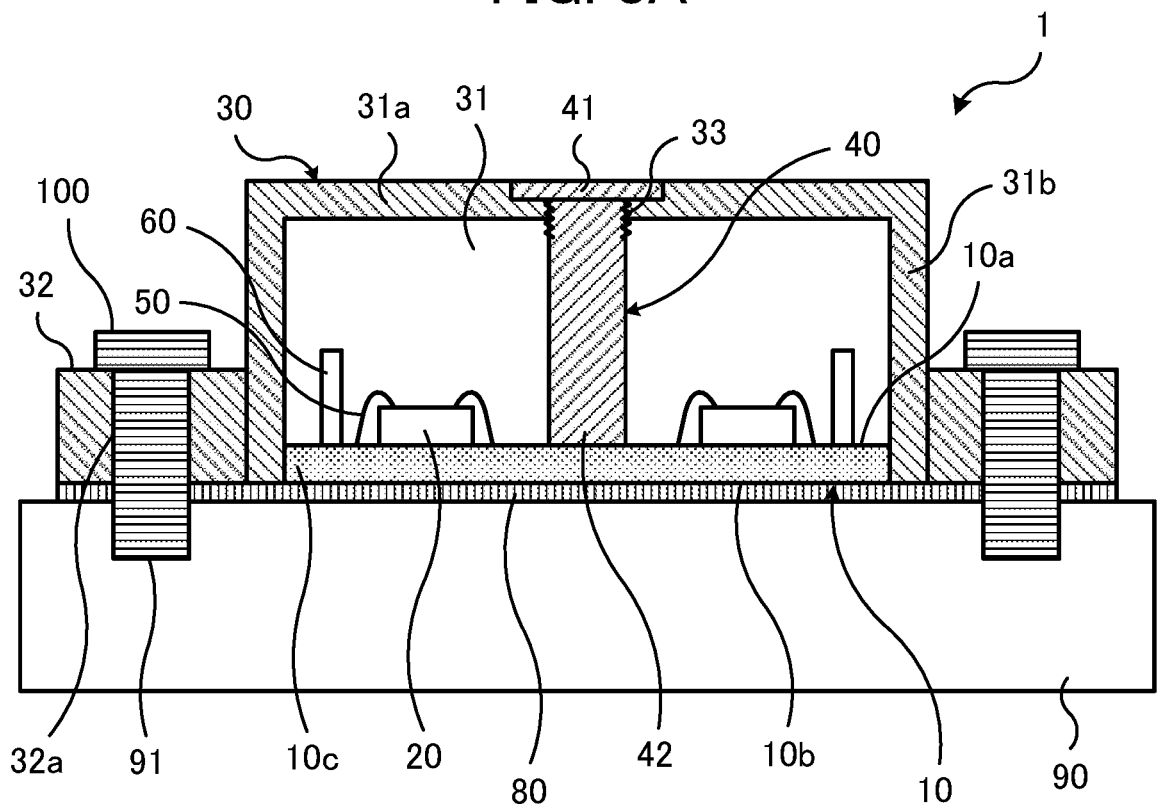

FIGS. 8A and 8B depict a second example of connecting the semiconductor device according to the first embodiment to a cooler. FIG. 8A is a schematic cross-sectional view of a principal part of one example of a cooler connecting step for this second example. FIG. 8B is a schematic cross-sectional view of a principal part of one example of a deformation adjusting step for an insulated substrate for this second example.

When connecting the cooler 90 via the TIM 80 to the main surface 10b side of the insulated substrate 10, as one example, it is possible to use a method like that depicted in FIGS. 8A and 8B.

First, as depicted in FIG. 8A, the case housing 30 that houses the insulated substrate 10, on which the semiconductor elements 20 have been mounted and which has deformed, is connected to a cooler 90. That is, the cooler 90 is connected via the TIM 80, such as thermal grease or a thermal sheet, to the main surface 10b side of the insulated substrate 10 which is exposed from the case housing 30. By inserting the screws 100 into the fixing holes 32a of the case housing 30 and screwing the screws 100 into the screw holes 91 of the cooler 90, the case housing 30 is connected to and fixed to the cooler 90. When doing so, since the insulated substrate 10 is deformed, a void (hollow) 110 that is not filled with the TIM 80 may be formed between the main surface 10b and the cooler 90 as depicted in FIG. 8A.

After the case housing 30 has been connected to the cooler 90 in this way, as depicted in FIG. 8B, the deformation of the insulated substrate 10 is adjusted according to the example described with reference to FIGS. 3A and 3B. That is, deformation of the insulated substrate 10 is adjusted by inserting and screwing the screw 40 into the screw hole 33 of the case housing 30, placing the tip portion 42 of the screw 40 into contact with the main surface 10a side of the insulated substrate 10, and further adjusting the screwed-in depth of the screw 40 in the screw hole 33. By adjusting the deformation of the insulated substrate 10 using the screw 40, voids 110 like that depicted in FIG. 8A are eliminated, so that as depicted in FIG. 8B, the space between the main surface 10b of the insulated substrate 10 and the cooler 90 becomes filled with the TIM 80.

As one example, the semiconductor device 1 is obtained by using a method like that depicted in FIGS. 8A and 8B to connect the cooler 90 via the TIM 80 to the main surface 10b side, which is exposed from the case housing 30, of the insulated substrate 10 that has the semiconductor elements 20 mounted on the main surface 10a side and is housed in the case housing 30.

With the method depicted in FIGS. 8A and 8B, deformation of the insulated substrate 10 is adjusted by the screw 40 after the cooler 90 has been connected via the TIM 80 to the main surface 10b side of the insulated substrate 10 which has deformed. Using the method depicted in FIGS. 8A and 8B, it is also possible to adjust the deformation of the insulated substrate 10 using the screw 40 in keeping with the form (unevenness and the like) of the connecting surface of the cooler 90 to be connected to the main surface 10b side of the insulated substrate 10. With the method depicted in FIGS. 8A and 8B, it is possible to suppress the formation of the void 110 that is not filled with the TIM 80 between the main surface 10b of the insulated substrate 10 and the cooler 90. This means that it is possible to prevent an increase in thermal resistance between the insulated substrate 10 and the cooler 90. By doing so, heat dissipation from the insulated substrate 10, on which the semiconductor elements 20 that generate heat during operations are mounted, to the cooler 90 is enhanced, and overheating of the semiconductor elements 20 and deterioration in performance or breakage of the semiconductor elements 20 due to overheating may be suppressed.

Note that with the method depicted in FIGS. 8A and 8B, the case housing 30 may be filled with the encapsulating resin 70 according to the example in FIG. 6A before the cooler 90 is connected. Alternatively, the case housing 30 may be filled with the encapsulating resin 70 after the cooler 90 has been connected and before or after adjustment of deformation of the insulated substrate 10 using the screw 40.

With the above procedure, it is possible to obtain the semiconductor device 1 where the cooler 90 is connected via the TIM 80 to the main surface 10b side of the insulated substrate 10, which has the semiconductor elements 20 mounted on the main surface 10a side and is bonded to the case housing 30 so that the main surface 10b side is exposed. In the semiconductor device 1, heat generated by the semiconductor elements 20 during operation is transmitted via the insulated substrate 10 and the TIM 80 to the cooler 90 and dissipated. By doing so, as described above, it is possible to suppress overheating of the semiconductor elements 20 and deterioration in performance and breakage of the semiconductor elements 20 due to overheating.

With the semiconductor device 1, deformation of the insulated substrate 10 is adjusted by inserting and screwing the screw 40 into the screw hole 33 of the case housing 30, placing the tip portion 42 of the screw 40 into contact with the main surface 10a side of the insulated substrate 10 and further adjusting the screwed-in depth of the screw 40 into the screw hole 33. As a result, it is possible to suppress the occurrence of large gaps at positions between the main surface 10b of the insulated substrate 10 and the cooler 90 and the production of voids that are not entirely filled with the TIM 80. By doing so, it is possible to avoid increases in thermal resistance between the insulated substrate 10 and the cooler 90 and to increase the dissipation of heat generated at the semiconductor elements 20 via the insulated substrate 10 and the TIM 80 to the cooler 90.

The heat generated by switching operations of the semiconductor elements 20 may exert a force that causes deformation of the insulated substrate 10. When the insulated substrate 10 is not pressed by the screw 40 as in the semiconductor device 1, the insulated substrate 10 will repeatedly deform in accordance with switching operations of the semiconductor elements 20, and due to this, the TIM 80 in the form of thermal grease may be squeezed out, that is, a phenomenon called "pumping out" may occur where the TIM 80 between the insulated substrate 10 and the cooler 90 becomes depleted. When pumping out occurs, there is the risk of voids that are not entirely filled with the TIM 80 being produced between the insulated substrate 10 and the cooler 90, which would increase the thermal resistance between the insulated substrate 10 and the cooler 90, resulting in the risk of overheating of the semiconductor elements 20 and possible deterioration in performance and breakage of the semiconductor elements 20.

On the other hand, in the semiconductor device 1, since the insulated substrate 10 is pressed by the screw 40, repeated deformation of the insulated substrate 10 that would accompany switching operations of the semiconductor elements 20 is restricted, which suppresses pumping out of the TIM 80. As a result, it is possible to suppress increases in thermal resistance between the insulated substrate 10 and the cooler 90, which suppresses overheating of the semiconductor elements 20 and resulting deterioration in performance and breakage of the semiconductor elements 20.

Accordingly, a high-performance and high-quality semiconductor device 1 with superior heat dissipation and durability is realized.

In the semiconductor device 1, to enable the deformation of the insulated substrate 10 to be adjusted, it does not need to adjust the thicknesses of the conductive layers (as examples, the conductive layers 12 and 13 described above) provided in the semiconductor device 1 or to provide an insulated substrate 10 where the thicknesses of the conductive layers have been adjusted. This makes it possible to suppress increases in the cost of the semiconductor device 1.

As a result, a high-performance and high-quality semiconductor device 1 with superior heat dissipation and durability is realized at low cost.

Second Embodiment

Figure 9A:
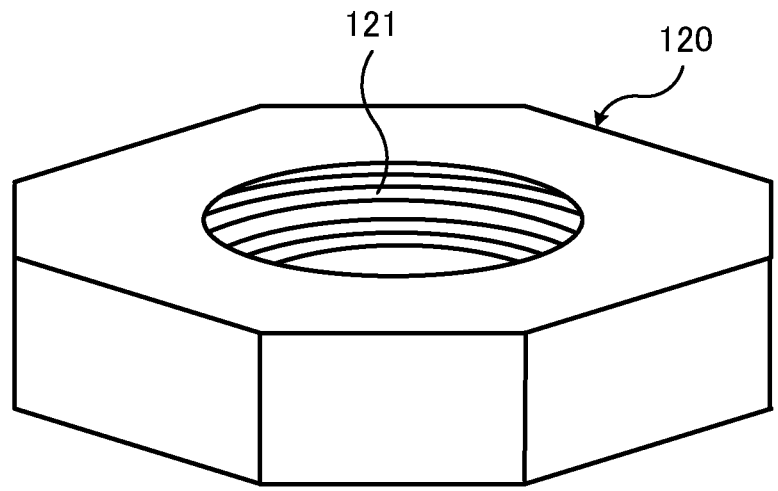
FIGS. 9A and 9B depict one example of a case housing of a semiconductor device according to a second embodiment.
Figure 9B:
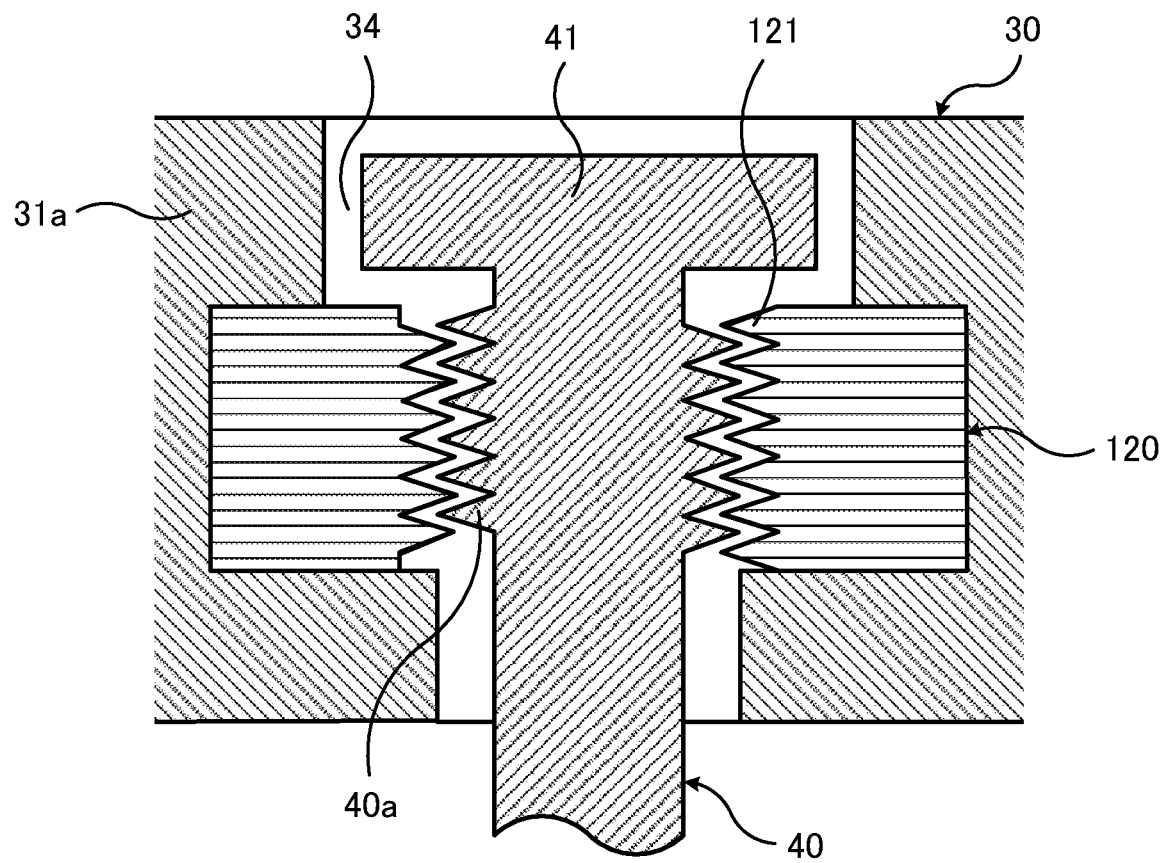

FIGS. 9A and 9B depict one example of a case housing of a semiconductor device according to a second embodiment. FIG. 9A is a schematic perspective view of one example of a nut according to the second embodiment. FIG. 9B is a schematic cross-sectional view of a principal part of one example of a case housing according to the second embodiment that is provided with an embedded nut and a screw that is screwed into the nut.

The case housing 30 of the semiconductor device 1 may use a structure like that depicted in FIG. 9B in which a nut 120 like that depicted in FIG. 9A is embedded. The case housing 30 is formed using PPS resin or the like. The case housing 30 in which the nut 120 is embedded is formed by insert molding. A nut with a screw hole 121 into which the screw 40 that adjusts the deformation of the insulated substrate 10 may be screwed is used as the nut 120. The nut 120 is embedded at a part of the case housing 30 that corresponds to the screw hole 33, that is, a part that faces the main surface 10a of the insulated substrate 10 on which the semiconductor elements 20 are mounted. For the case housing 30 in which the nut 120 is embedded, the screw hole 121 of the embedded nut 120 functions as the screw hole 33 of the case housing 30.

In cases where resin is used for the case housing 30 and metal or ceramic, which are harder than the resin used for the case housing 30, is used for the screw 40, when the screw hole 33 is made of resin, there is the risk of the screw hole 33 (or more precisely, a screw thread 33a of the screw hole 33) becoming abraded, which may prevent adjustment of deformation of the insulated substrate 10 by screwing in the screw 40. On the other hand, as depicted in FIG. 9B, by embedding the nut 120 made of steel in the case housing 30 and screwing the screw 40 into the nut 120, it is possible to suppress the occurrence of a case where abrasion prevents the screw 40 from being screwed in, which would prevent adjustment to deformation of the insulated substrate 10.

Third Embodiment

Figure 10A:
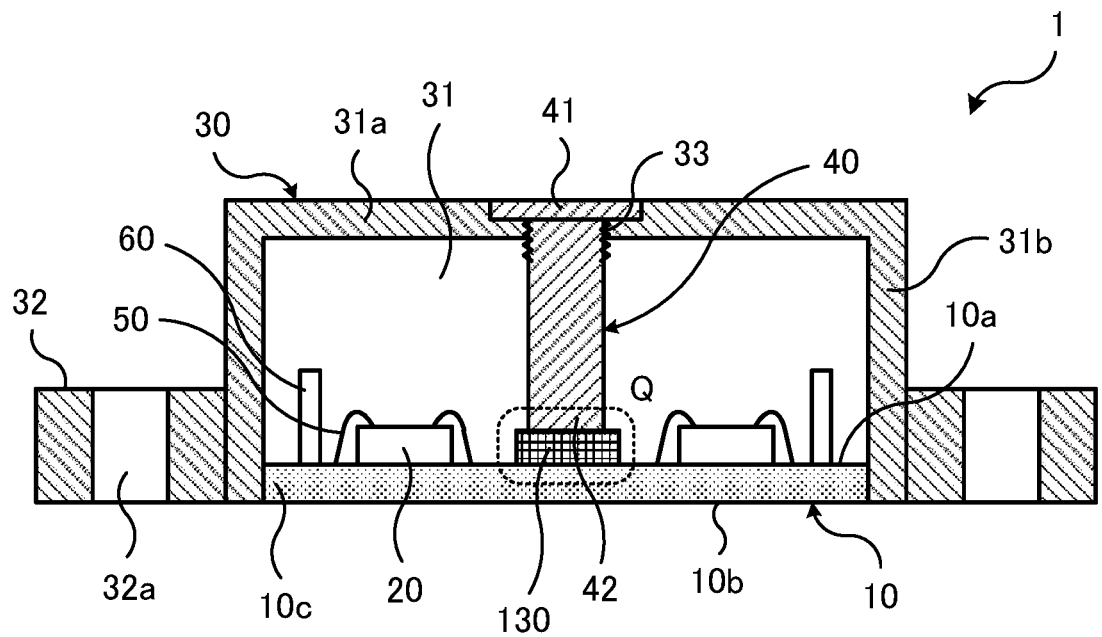
FIGS. 10A and 10B depict one example of a semiconductor device according to a third embodiment.
Figure 10B:
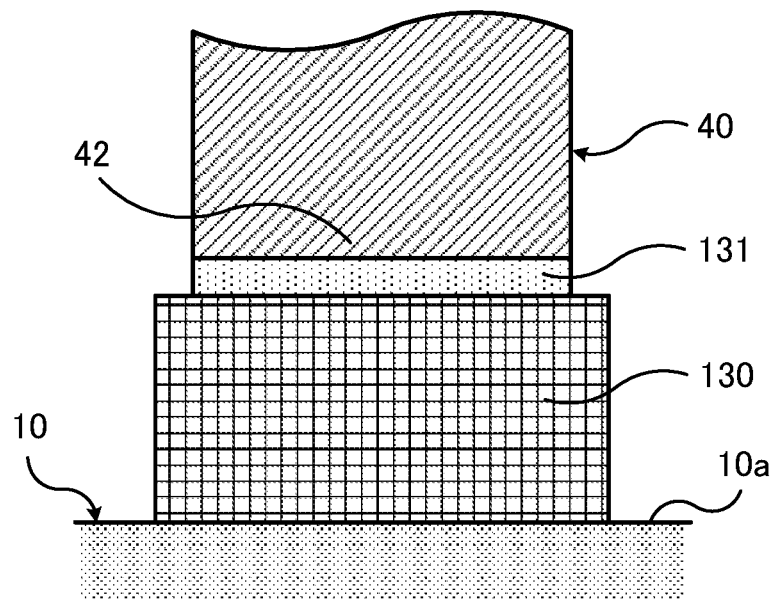

FIGS. 10A and 10B depict one example of a semiconductor device according to a third embodiment. FIG. 10A is a schematic cross-sectional view of a principal part of one example of a semiconductor device according to the third embodiment. FIG. 10B is a schematic enlarged view of a part labelled "Q" in FIG. 10A.

A stress relieving layer 130 like that depicted in FIGS. 10A and 10B may be provided at the tip portion 42 of the screw 40 screwed into the screw hole 33 of the case housing 30 of the semiconductor device 1. A material capable of absorbing stress that accompanies the screwing in of the screw 40, such as fluororesin, elastomer resin, PBT resin, PPS resin, aluminum or indium, is used as the stress relieving layer 130. As one example, as depicted in FIG. 10B, the stress relieving layer 130 is bonded to the tip portion 42 of the screw 40 using an adhesive 131.

During assembly of the semiconductor device 1, the screw 40 provided with the stress relieving layer 130 at the tip portion 42 is screwed into the screw hole 33 of the case housing 30, and the stress relieving layer 130 at the tip portion 42 is placed in contact with the main surface 10a side of the insulated substrate 10 on which the semiconductor elements 20 are mounted. The insulated substrate 10 is pressed by the stress relieving layer 130 provided at the tip portion 42 of the screw 40 to adjust the deformation of the insulated substrate 10. In this way, the insulated substrate 10 is pressed by the stress relieving layer 130. As a result, concentration of stress in the insulated substrate 10 that accompanies the screwing in of the screw 40 is suppressed, which relieves the stress in the insulated substrate 10. By doing so, it is possible to prevent breakage of the insulated substrate 10 (for example, the ceramic substrate 11 of the insulated substrate 10) due to stress that accompanies the screwing in of the screw 40.

Note that when a screw 40 provided with the stress relieving layer 130 at the tip portion 42 is used in this way, it is also possible to embed the nut 120 in the case housing 30 and screw the screw 40 into the nut 120 according to the example described above in the second embodiment.

Fourth Embodiment

Figure 11A:
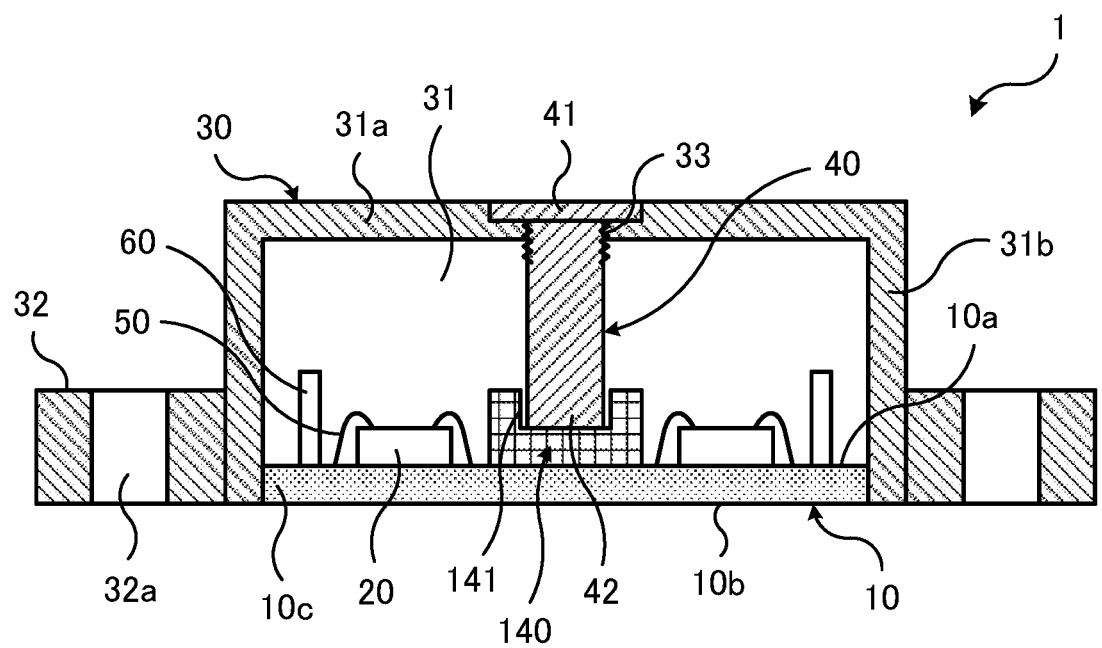
FIGS. 11A and 11B depict one example of a semiconductor device according to a fourth embodiment.
Figure 11B:
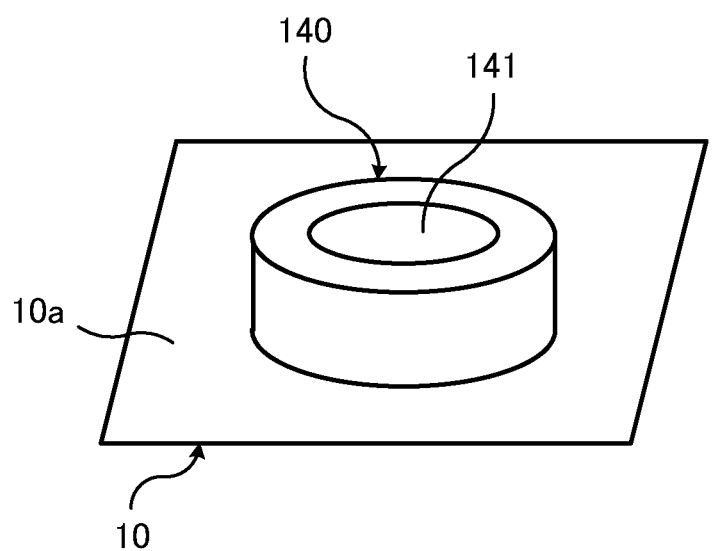

FIGS. 11A and 11B depict one example of a semiconductor device according to a fourth embodiment. FIG. 11A is a schematic cross-sectional view of a principal part of one example of the semiconductor device according to the fourth embodiment. FIG. 11B is a schematic perspective view of a principal part of one example of an insulated substrate with a screw receptacle according to the fourth embodiment.

As depicted in FIGS. 11A and 11B, a screw receptacle 140, which is contacted by the tip portion 42, may be provided on the insulated substrate 10 of the semiconductor device 1 at a part facing the tip portion 42 of the screw 40 screwed into the screw hole 33 of the case housing 30. As one example of the screw receptacle 140, a column-shaped member equipped with a recess 141, which has a bottom and a larger diameter than the tip portion 42, at a part of the screw receptacle 140 contacted by the tip portion 42 is used. The screw receptacle 140 is formed using a material such as copper, iron, ceramic, or resin. The screw receptacle 140 is bonded to the main surface 10a side of the insulated substrate 10 on which the semiconductor elements 20 are mounted using a joining material such as solder or adhesive. As examples, the screw receptacle 140 is joined to the main surface 10a side of the insulated substrate 10 using tin-based solder, gold-based solder, a sintered material with metal particles of silver or copper, an inorganic adhesive, an organic adhesive, or the like.

As one example, when the screw receptacle 140 that uses a metal such as copper is joined to a conductive layer (for example, the conductive layer 12 described above) on the insulated substrate 10, solder may be used as the joining material and the screw receptacle 140 may be joined in the same process as the joining of the semiconductor elements 20 to the conductive layer using solder.

When assembling the semiconductor device 1, the screw 40 is screwed into the screw hole 33 of the case housing 30 and the tip portion 42 is placed in contact with (the recess 141 of) the screw receptacle 140 provided on the main surface 10a side of the insulated substrate 10. The insulated substrate 10 is pressed by the screw receptacle 140 contacted by the tip portion 42 of the screw 40, thereby adjusting the deformation of the insulated substrate 10. In this way, the insulated substrate 10 is pressed by the screw receptacle 140 provided on the main surface 10a side. This suppresses the concentration of stress that accompanies the screwing in of the screw 40 in the insulated substrate 10, and relieves the stress in the insulated substrate 10. As a result, it is possible to prevent the insulated substrate 10 (for example, the ceramic substrate 11 of the insulated substrate 10) from breaking due to stress that accompanies the screwing in of the screw 40.

Note that even when the screw receptacle 140 is provided in this way on the insulated substrate 10, it is also possible to embed a nut 120 in the case housing 30 and screw the screw 40 into the nut 120 according to the example described above in the second embodiment.

Aside from this, it is also possible to provide a stress relieving layer 130 at the tip portion 42 of the screw 40 and to place the stress relieving layer 130 in contact with the screw receptacle 140 according to the example described above in the third embodiment.

Figure 12A:
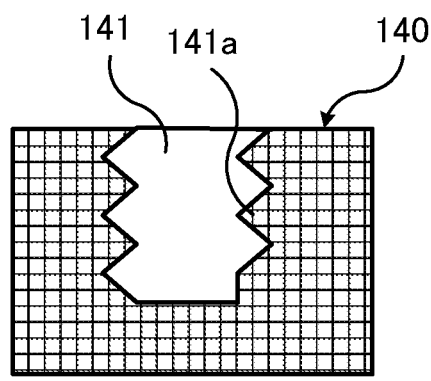
FIGS. 12A and 12B depict an example modification to a screw receptacle and a screw according to the fourth embodiment.
Figure 12B:
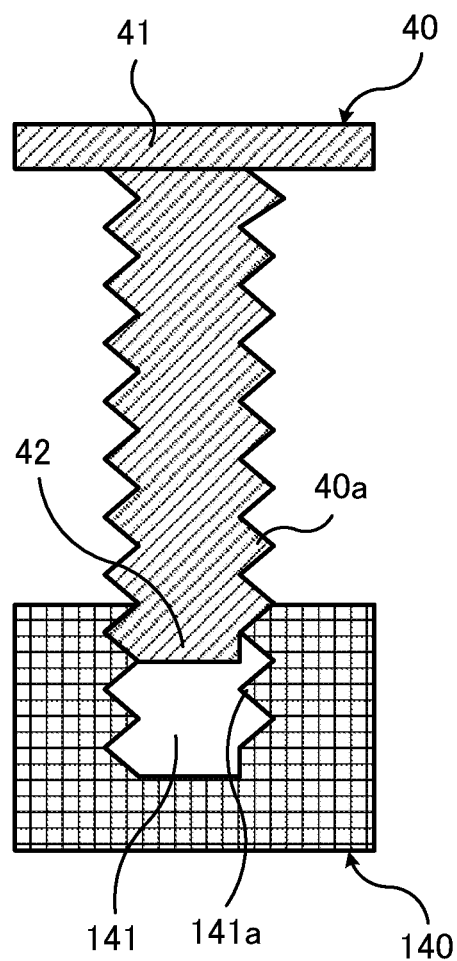

Further, FIGS. 12A and 12B depict an example modification to the screw receptacle and the screw according to the fourth embodiment. FIG. 12A is a schematic cross-sectional view of a principal part of a modification of the screw receptacle according to the fourth embodiment. FIG. 12B is a schematic cross-sectional view of a principal part of an example modification of the screw receptacle and the screw according to the fourth embodiment.

The recess 141 in the screw receptacle 140 may be a screw hole in which a (female) screw thread 141a is formed as depicted in FIGS. 12A and 12B. In this case, a (male) screw thread 40a with a pitch corresponding to the screw thread 141a of the recess 141 in the screw receptacle 140 is formed at the tip portion 42 of the screw 40 to be screwed into the screw hole 33 of the case housing 30, in addition to the part of the screw 40 screwed into the screw hole 33.

During assembly of the semiconductor device 1, when the screw 40 is screwed into the screw hole 33 of the case housing 30 and the tip portion 42 reaches the screw receptacle 140, the tip portion 42 is screwed into the recess 141 where the screw thread 141a of the screw receptacle 140 is formed. The insulated substrate 10 is pressed by the screw receptacle 140 into which the tip portion 42 of the screw 40 has been screwed, thereby adjusting the deformation of the insulated substrate 10. Due to the screw 40 being screwed into the case housing 30 and also into the screw receptacle 140, it is possible to suppress displacement in the lateral direction of the tip portion 42 of the screw 40 that presses the insulated substrate 10, that is, displacement in a direction that is parallel to the main surface 10a of the insulated substrate 10, which makes the structure more stable.

The insulated substrate 10 is pressed by the screw receptacle 140 provided on the main surface 10a side of the insulated substrate 10. This suppresses the concentration of stress that accompanies the screwing in of the screw 40 in the insulated substrate 10, and relieves the stress in the insulated substrate 10. As a result, it is possible to prevent the insulated substrate 10 (for example, the ceramic substrate 11 of the insulated substrate 10) from breaking due to stress that accompanies the screwing in of the screw 40.

Note that even when the screw receptacle 140 including the recess 141 in which the screw thread 141a is formed is provided in this way on the insulated substrate 10, it is also possible to embed a nut 120 in the case housing 30 and screw the screw 40 into the nut 120 according to the example described in the second embodiment.

Fifth Embodiment

Figure 13A:
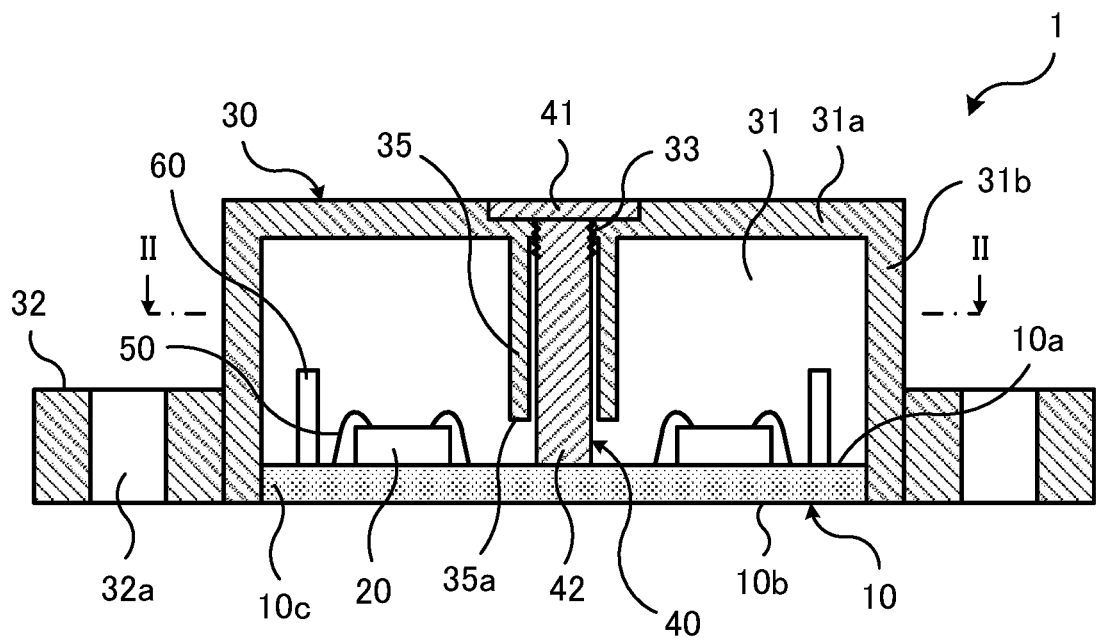
FIGS. 13A and 13B depict a first example of a semiconductor device according to a fifth embodiment.
Figure 13B:
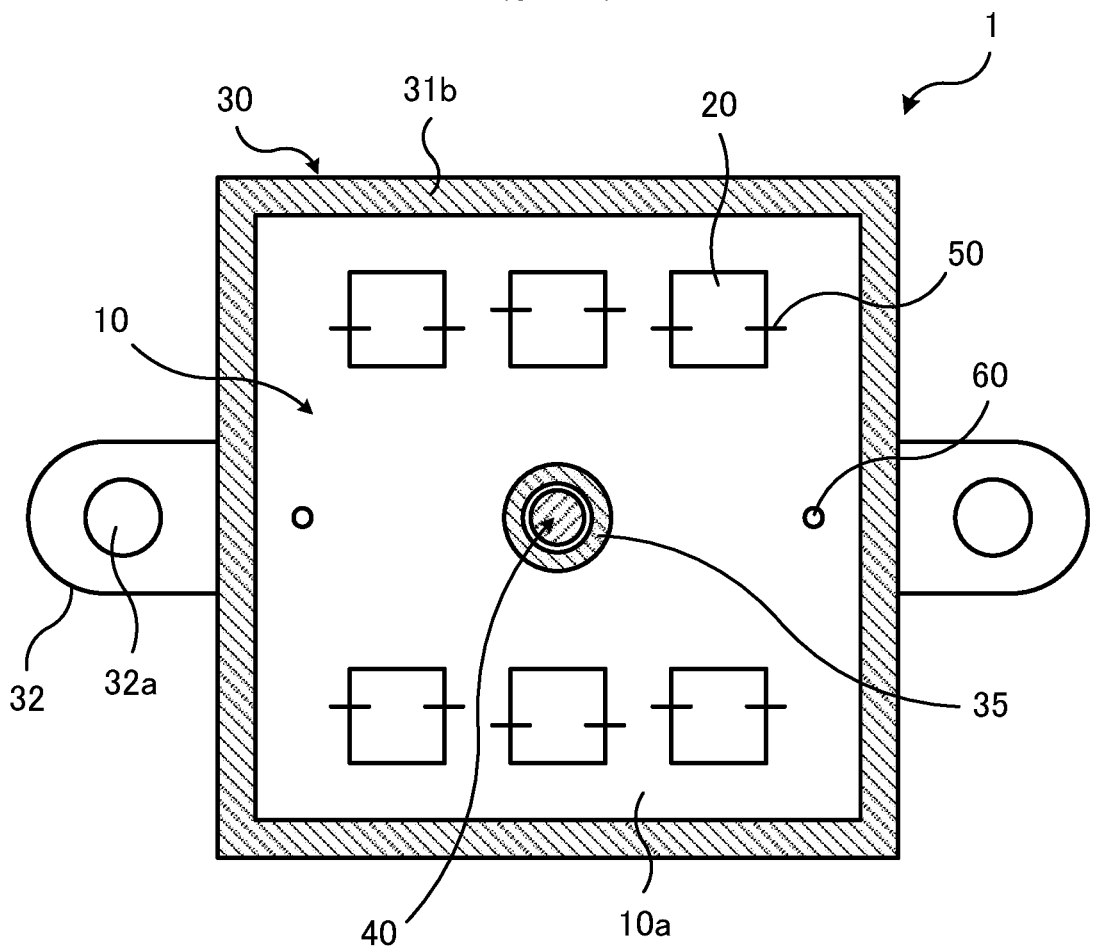

FIGS. 13A and 13B depict a first example of a semiconductor device according to a fifth embodiment. FIG. 13A is a schematic cross-sectional view of a principal part of the first example of a semiconductor device according to the fifth embodiment. FIG. 13B is a schematic cross-sectional view along a line II-II in FIG. 13A.

As depicted in FIGS. 13A and 13B, a tubular insertion portion 35 that communicates with the screw hole 33 and extends from the screw hole 33 toward the main surface 10a side of the insulated substrate 10 may be provided in the case housing 30 of the semiconductor device 1. A length of the insertion portion 35 is set so that a tip portion 35a thereof that extends toward the insulated substrate 10 does not reach the main surface 10a of the insulated substrate 10. As one example, the insertion portion 35 is set at a length that does not reach the main surface 10a of the insulated substrate 10 in a warped or otherwise deformed state before deformation is adjusted using the screw 40.

During assembly of the semiconductor device 1, the screw 40 is inserted into the screw hole 33 of the case housing 30 and the insertion portion 35 and is screwed into the screw hole 33. After this, the tip portion 42 of the screw 40 is placed in contact with the main surface 10a side of the insulated substrate 10 on which the semiconductor elements 20 are mounted. When doing so, the tip portion 42 of the screw 40 protrudes from the insertion portion 35 and comes into contact with the main surface 10a side of the insulated substrate 10. The insulated substrate 10 is pressed by the tip portion 42 of the screw 40 to adjust the deformation of the insulated substrate 10. By inserting the screw 40 into the insertion portion 35, displacement in the lateral direction of the tip portion 42 of the screw 40 that presses the insulated substrate 10, that is, displacement in a direction parallel to the main surface 10a of the insulated substrate 10, is suppressed, which makes the structure more stable.

Note that even when the insertion portion 35 is provided on the case housing 30 in this way, it is also possible to embed a nut 120 in the case housing 30 and to screw the screw 40 into the nut 120 according to the example described above in the second embodiment.

Aside from this, it is also possible to provide a stress relieving layer 130 at the tip portion 42 of the screw 40 and to place the stress relieving layer 130 in contact with the insulated substrate 10 according to the example described above in the third embodiment.

When the insertion portion 35 is provided in the case housing 30, as one example, resin encapsulation may be performed before screwing in the screw 40 and adjusting the deformation of the insulated substrate 10 by screwing in the screw 40.

Figure 14A:
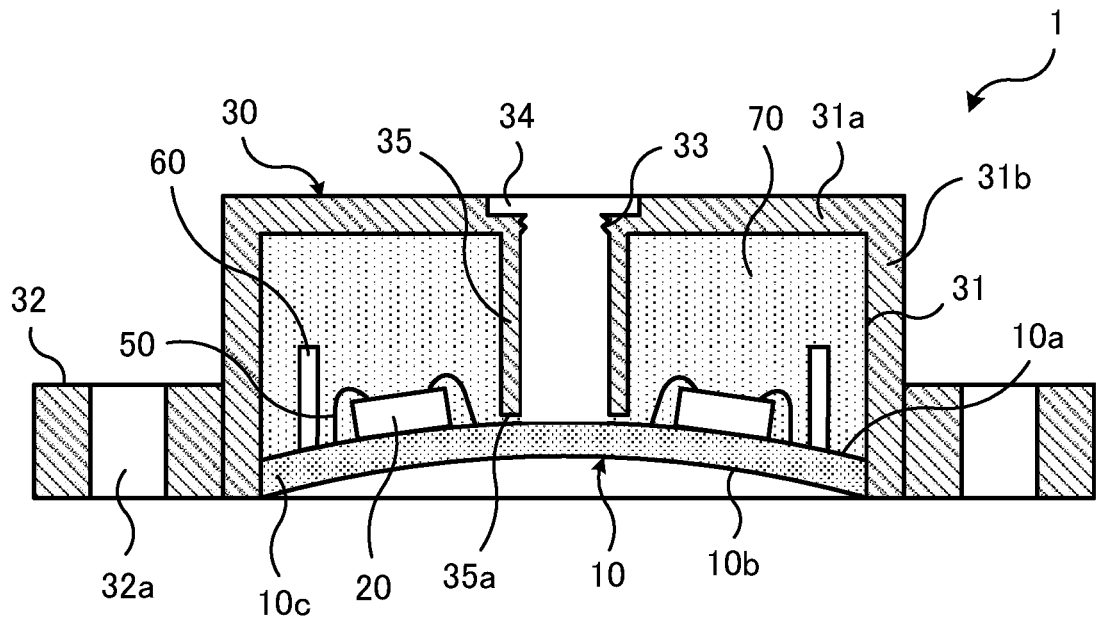
FIGS. 14A and 14B depict one example of resin encapsulation of a semiconductor device according to the fifth embodiment.
Figure 14B:
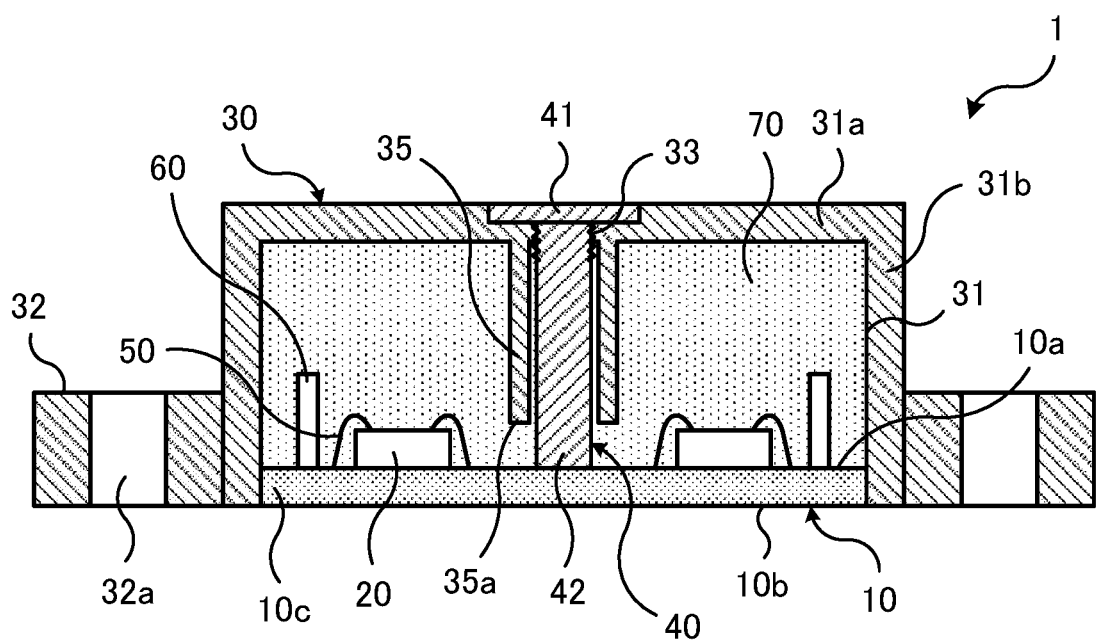

FIGS. 14A and 14B depict one example of resin encapsulation of a semiconductor device according to the fifth embodiment. FIG. 14A is a schematic cross-sectional view of a principal part of one example of a resin encapsulation step. FIG. 14B is a schematic cross-sectional view of a principal part of one example of a deformation adjusting step for an insulated substrate.

First, as depicted in FIG. 14A, the internal space 31 of the case housing 30 that houses the insulated substrate 10, on which the semiconductor elements 20 have been mounted and which has deformed, is filled with the encapsulating resin 70. As the encapsulating resin 70 used in this case, a resin material that is soft or deformable such as a silicone resin, or a resin material containing an insulating filler is used. The encapsulating resin 70 that fills the internal space 31 of the case housing 30 encapsulates the semiconductor elements 20 mounted on the main surface 10a side of the insulated substrate 10 and the wires 50 and the terminal components 60 connected to the semiconductor elements 20. On the other hand, it is difficult for the encapsulating resin 70 to fill the insertion portion 35 provided in the case housing 30. However, the encapsulating resin 70 may flow into part of the insertion portion 35.

After the internal space 31 of the case housing 30 has been filled with the encapsulating resin 70 in this way, as depicted in FIG. 14B, the screw 40 is inserted into the screw hole 33 and the insertion portion 35 of the case housing 30, the screw 40 is screwed into the screw hole 33, and the tip portion 42 of the screw 40 is placed in contact with the main surface 10a side of the insulated substrate 10. After this, the depth by which the screw 40 is screwed into the screw hole 33 is further adjusted to adjust the deformation of the insulated substrate 10.

When the case housing 30 provided with the insertion portion 35 is used, it becomes relatively easy to adjust deformation of the insulated substrate 10 using the screw 40 after resin encapsulation. As one example, after resin encapsulation, it is possible to connect the cooler 90 via the TIM 80 to the main surface 10b side of the insulated substrate 10 according to the example in FIG. 8A described above and to then adjust the deformation of the insulated substrate 10 using the screw 40 according to the example in FIG. 8B described above in keeping with the form (unevenness and the like) of the connecting surface of the cooler 90. When the case housing 30 provided with the insertion portion 35 is used, it is difficult for the encapsulating resin 70 to flow into the insertion portion 35, which eliminates the need of pushing back the encapsulating resin 70 in order to insert and screw in the screw 40. When the case housing 30 provided with the insertion portion 35 is used, it is possible to use an arrangement where a product that has been completed as far as resin encapsulation is delivered and the cooler 90 is connected and deformation of the insulated substrate 10 is adjusted at the delivery destination.

Note that when the case housing 30 is provided with the insertion portion 35, filling the case housing 30 with the encapsulating resin 70 is not limited to being performed before the insertion and screwing in of the screw 40, and it is also possible to fill the case housing 30 with the encapsulating resin 70 after the screw 40 has been inserted and screwed in.

Figure 15A:
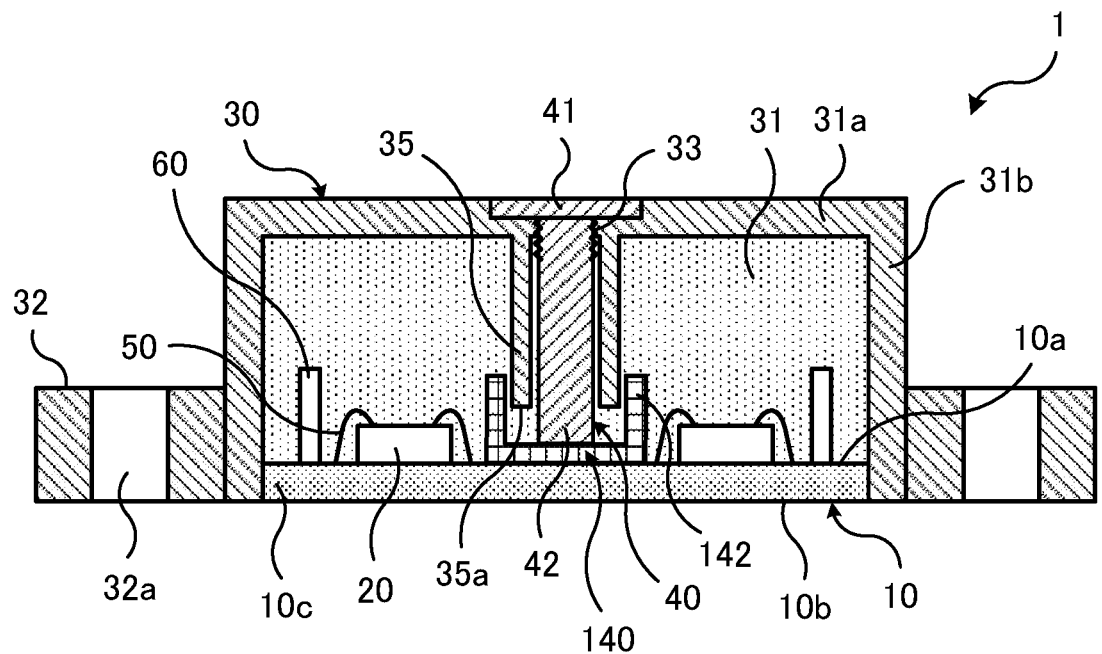
FIGS. 15A and 15B depict a second example of a semiconductor device according to the fifth embodiment.
Figure 15B:
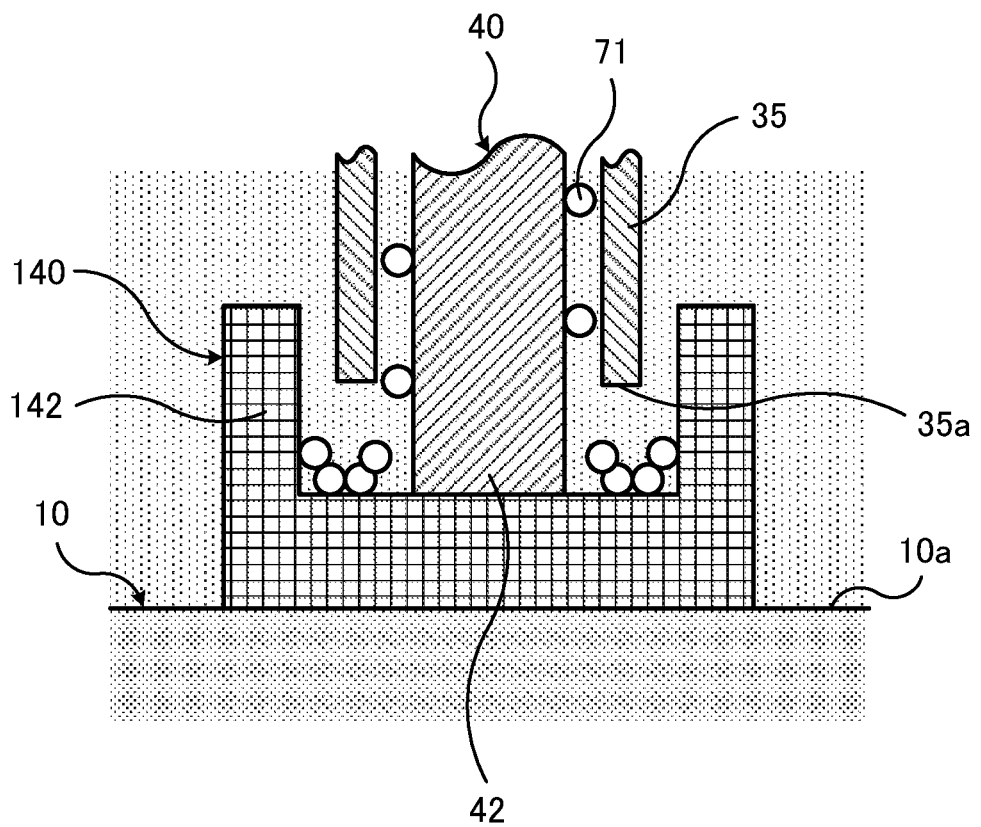

FIGS. 15A and 15B depict a second example of a semiconductor device according to the fifth embodiment. FIG. 15A is a schematic cross-sectional view of a principal part of the second example of a semiconductor device according to the fifth embodiment. FIG. 15B is a schematic cross-sectional view of a vicinity of a screw tip portion according to the fifth embodiment.

When an insertion portion 35 is provided on the case housing 30 of the semiconductor device 1, a screw receptacle 140 may be provided as depicted in FIG. 15A at the part of the main surface 10a side of the insulated substrate 10 that faces the insertion portion 35 of the case housing 30. As depicted in FIGS. 15A and 15B, the screw receptacle 140 is formed so as to include a wall portion 142 that externally surrounds part of the insertion portion 35 of the case housing 30 and also the tip portion 42 of the screw 40 that protrudes from the insertion portion 35 after deformation of the insulated substrate 10 has been adjusted.

During assembly of the semiconductor device 1, the screw 40 is inserted into the screw hole 33 and the insertion portion 35 of the case housing 30 and screwed into the screw hole 33. The tip portion 42 of the screw 40 is then placed in contact with the screw receptacle 140 provided on the main surface 10a side of the insulated substrate 10 on which the semiconductor elements 20 are mounted. The insulated substrate 10 is pressed by the screw receptacle 140 contacted by the tip portion 42 of the screw 40, thereby adjusting the deformation of the insulated substrate 10. The case housing 30 is filled with the encapsulating resin 70 before or after the screw 40 is inserted and screwed in.

As one example, as depicted in FIG. 15B, part of the encapsulating resin 70 that fills the case housing 30 may flow inside the wall portion 142 of the screw receptacle 140 and inside the insertion portion 35 of the case housing 30. When this happens, air may flow through the insertion portion 35 and produce bubbles 71 in the encapsulating resin 70 that has flowed inside the insertion portion 35. Even when such bubbles 71 are produced, since the screw receptacle 140 with the wall portion 142 is provided, the bubbles 71 are prevented from moving beyond the wall portion 142 and reaching the region outside the wall portion 142 where the semiconductor elements 20 are provided. As a result, poor encapsulation of the region with the semiconductor elements 20 is prevented.

Sixth Embodiment

Figure 16A:
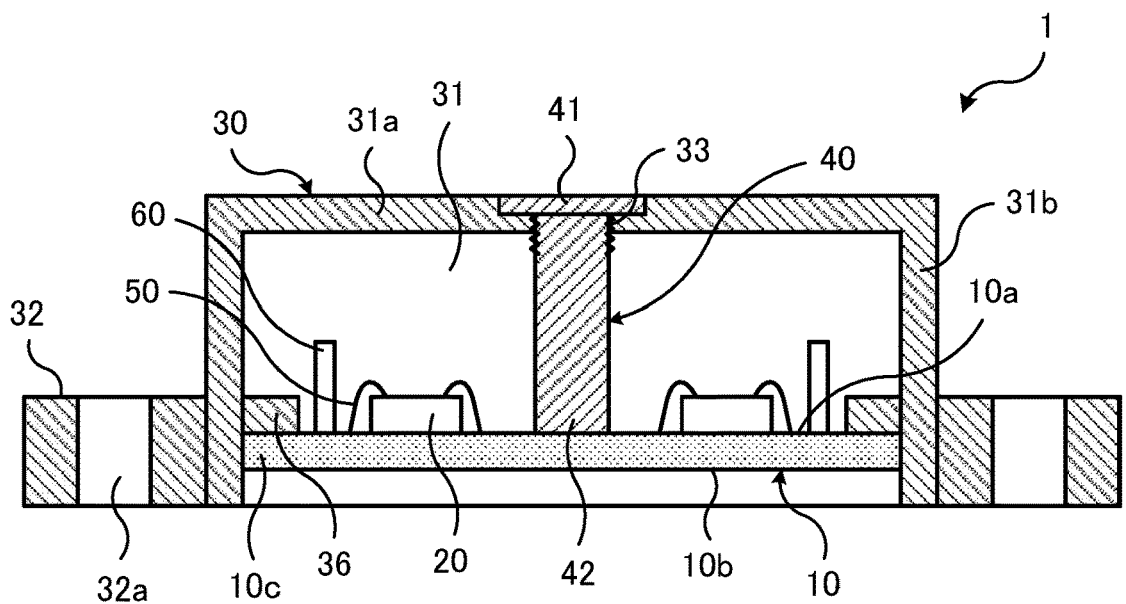
FIGS. 16A to 16C depict a first example of a semiconductor device according to a sixth embodiment.
Figure 16B:
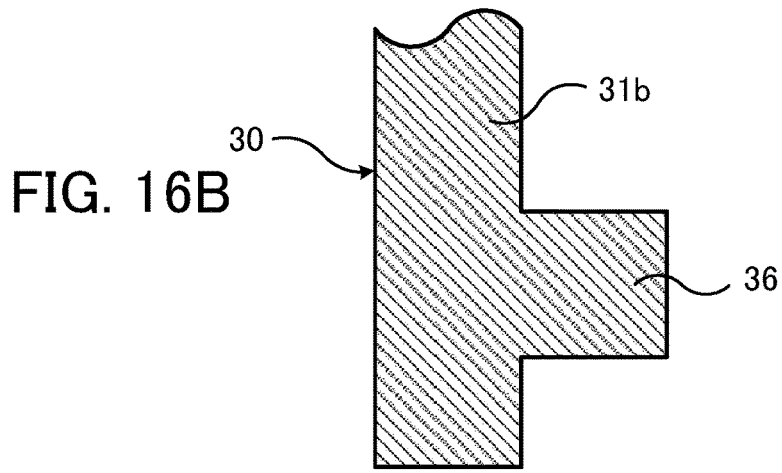
Figure 16C:
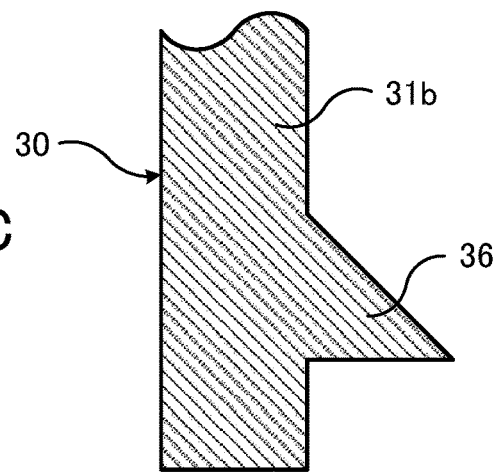

FIGS. 16A to 16C depict a first example of a semiconductor device according to a sixth embodiment. FIG. 16A schematically depicts a cross-sectional view of a principal part of a first example of a semiconductor device according to the sixth embodiment. FIGS. 16B and 16C are schematic cross-sectional views of a principal part of one example of a protrusion on a case housing according to the sixth embodiment.

In the semiconductor device 1, a protrusion 36 that protrudes from a side wall 31b of a case housing 30 toward the insulated substrate 10 may be provided as depicted in FIG. 16A on a portion of the case housing 30 to which the outer circumferential portion 10c of the insulated substrate 10 is bonded. The insulated substrate 10 is provided so that the main surface 10a side of the insulated substrate 10 is supported by the protrusion 36 on the case housing 30. The outer circumferential portion 10c of the insulated substrate 10 is bonded to the side wall 31b and the protrusion 36 of the case housing 30 using silicone adhesive or the like.

The protrusion 36 on the case housing 30 may be quadrangular in cross section as depicted in FIGS. 16A and 16B, or may be triangular in cross section as depicted in FIG. 16C. So long as it is possible to support the outer circumferential portion 10c of the insulated substrate 10 on and bond the outer circumferential portion 10c to the protrusion 36, there are no particular limitations on the shape of the protrusion 36.

Figure 17A:
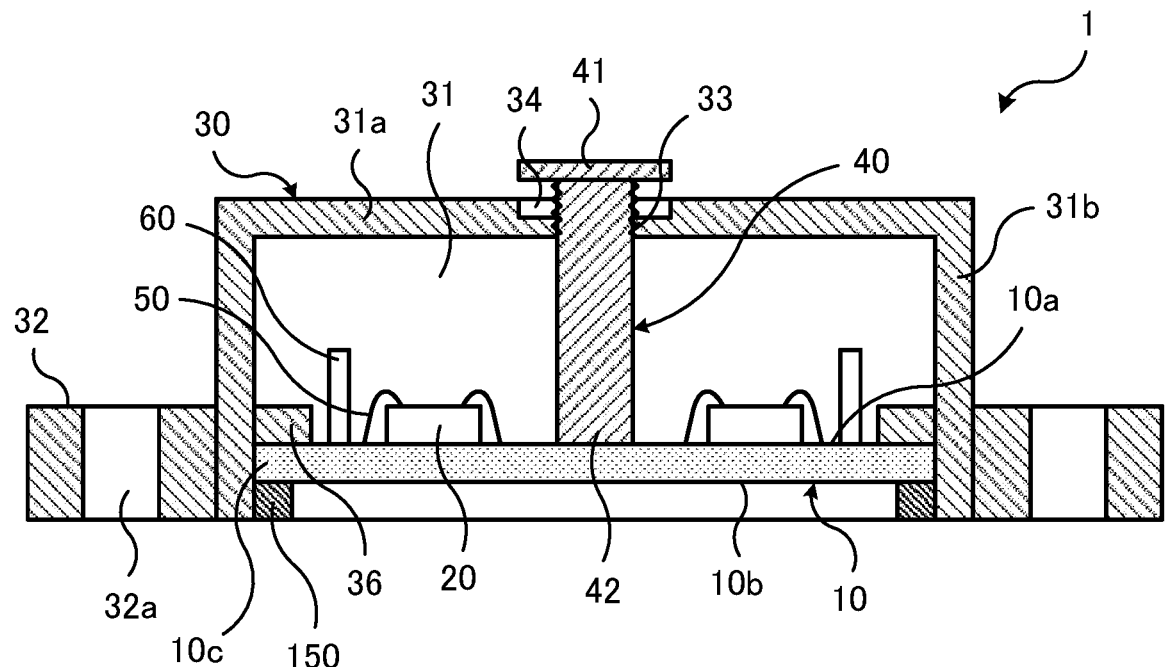
FIGS. 17A and 17B depict a second example of a semiconductor device according to the sixth embodiment.
Figure 17B:
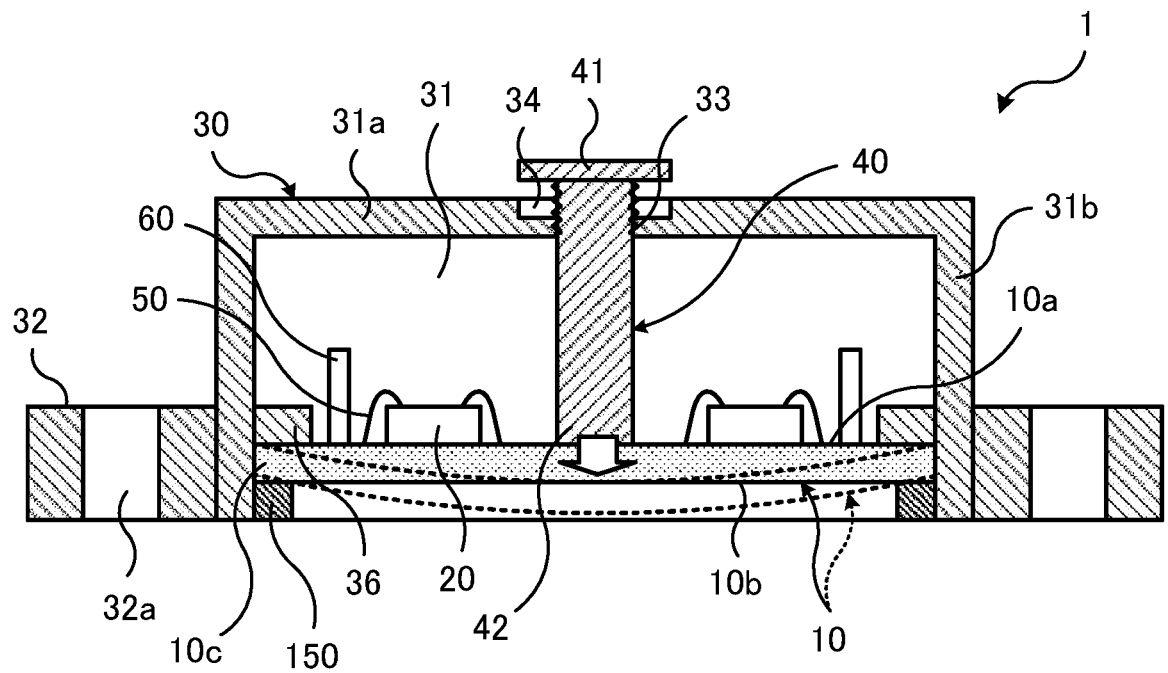

FIGS. 17A and 17B depict a second example of a semiconductor device according to a sixth embodiment. FIGS. 17A and 17B are schematic cross-sectional views of a principal part of the second example of a semiconductor device according to the sixth embodiment.

As depicted in FIG. 17A, a semiconductor device 1 that has the protrusion 36, which supports the main surface 10a side of the insulated substrate 10, provided on the case housing 30 may be further provided with a spacer ring 150 that supports the main surface 10b side of the insulated substrate 10. A material such as metal, ceramic, or resin is used for the spacer ring 150. As the spacer ring 150, it is preferable to use a material whose rigidity is the same or higher than the insulated substrate 10. The spacer ring 150 is bonded to the main surface 10b side of the outer circumferential portion 10c of the insulated substrate 10 and the side wall 31b of the case housing 30 using silicone adhesive or the like.

In the semiconductor device 1 provided with the spacer ring 150, as depicted in FIGS. 17A and 17B, during assembly, the insulated substrate 10 that is pressed by the tip portion 42 of the screw 40, which has been inserted and screwed into the screw hole 33 of the case housing 30 and placed in contact with the main surface 10a side, has its deformation adjusted with the main surface 10a side supported by the protrusion 36 and the main surface 10b side supported by the spacer ring 150. When the insulated substrate 10 is pressed by the screw 40, the spacer ring 150 serves as a pivot, so that a force that presses the insulated substrate 10 toward the protrusion 36 side acts on the outer circumferential portion 10c of the insulated substrate 10. As a result, it is possible, even when large convex warping has occurred for the insulated substrate 10 for example and the force pressing the insulated substrate 10 with the screw 40 increases to correct this warping, to prevent the insulated substrate 10 from coming out of the case housing 30 due to the pressing force of the screw 40.

With the semiconductor device 1 provided with the spacer ring 150, as one example, as depicted by the dotted line in FIG. 17B, deformation of the insulated substrate 10 is adjusted so as to produce warping in a concave shape. After the deformation of the insulated substrate 10 is adjusted to warp in a concave shape in this way, the insulated substrate 10 is connected to the cooler 90 provided via the TIM 80 on the main surface 10b side in accordance with the example in FIG. 7B or 8B. By adjusting the deformation of the insulated substrate 10 using the screw 40 in keeping with the form (unevenness and the like) of the connecting surface of the cooler 90 to be connected, it is possible to suppress an increase in the gap between the main surface 10b of the insulated substrate 10 and the cooler 90 and the production of a void that is not filled with the TIM 80. In addition, since the insulated substrate 10 is fixed in a state where the insulated substrate 10 is concave due to the screw 40, repeated deformation of the insulated substrate 10 that accompanies switching operations of the semiconductor elements 20 is restricted, which prevents the TIM 80 from being pumped out. By doing so, it is possible to prevent an increase in thermal resistance between the insulated substrate 10 and the cooler 90, which prevents overheating of the semiconductor elements 20 and deterioration in performance and breakage of the semiconductor elements 20 due to overheating.

The spacer ring 150 is described further below.

Figure 18A:
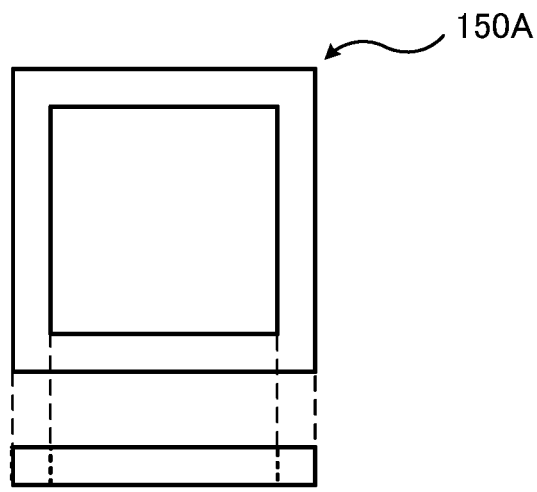
FIGS. 18A to 18C depict one example of a spacer according to the sixth embodiment.
Figure 18B:
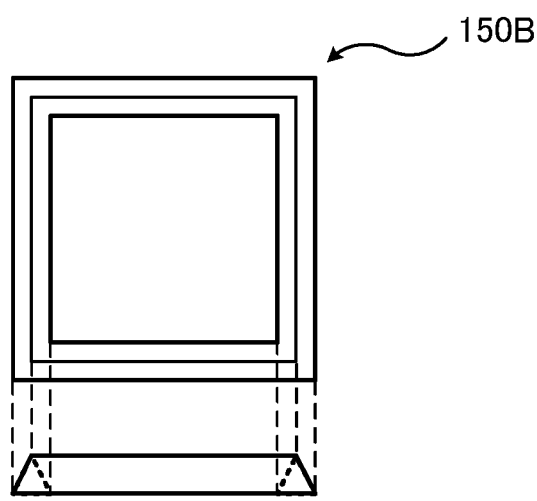
Figure 18C:
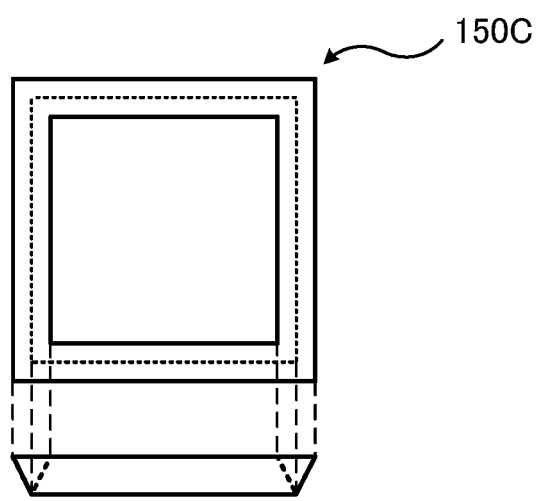

FIGS. 18A to 18C depict one example of a spacer according to the sixth embodiment. FIGS. 18A to 18C are schematic plan views and side views of examples of the spacer according to the sixth embodiment.

As one example, a spacer ring 150A with a shape like that depicted in FIG. 18A is used as the spacer ring 150 described above. The spacer ring 150A depicted in FIG. 18A is a member in the form of a rectangular frame when viewed from above. A side of the spacer ring 150A that is connected to the main surface 10b of the insulated substrate 10 is a flat surface.

In addition, as the spacer ring 150, for example, a spacer ring 150B with the shape depicted in FIG. 18B or a spacer ring 150C with the shape depicted in FIG. 18C may be used. The spacer ring 150B depicted in FIG. 18B is a member in the form of a rectangular frame when viewed from above and makes line contact with the main surface 10b of the insulated substrate 10. The spacer ring 150C depicted in FIG. 18C is also a member in the form of a rectangular frame when viewed from above, where the spacer ring 150B depicted in FIG. 18B is inverted and the side connected to the main surface 10b of the insulated substrate 10 is a flat surface.

As examples, the spacer ring 150A like that depicted in FIG. 18A may be provided relatively easily at low cost, which makes it possible to suppress the increase in cost of the semiconductor device 1 by the use of the spacer ring 150A. With the spacer ring 150B like that depicted in FIG. 18B and the spacer ring 150C like that depicted in FIG. 18C, it is possible to reduce the weight of the member while suppressing a drop in strength, which makes it possible to suppress the increase in weight of the semiconductor device 1 by the use of the spacer ring 150B or the spacer ring 150C.

Figure 19:
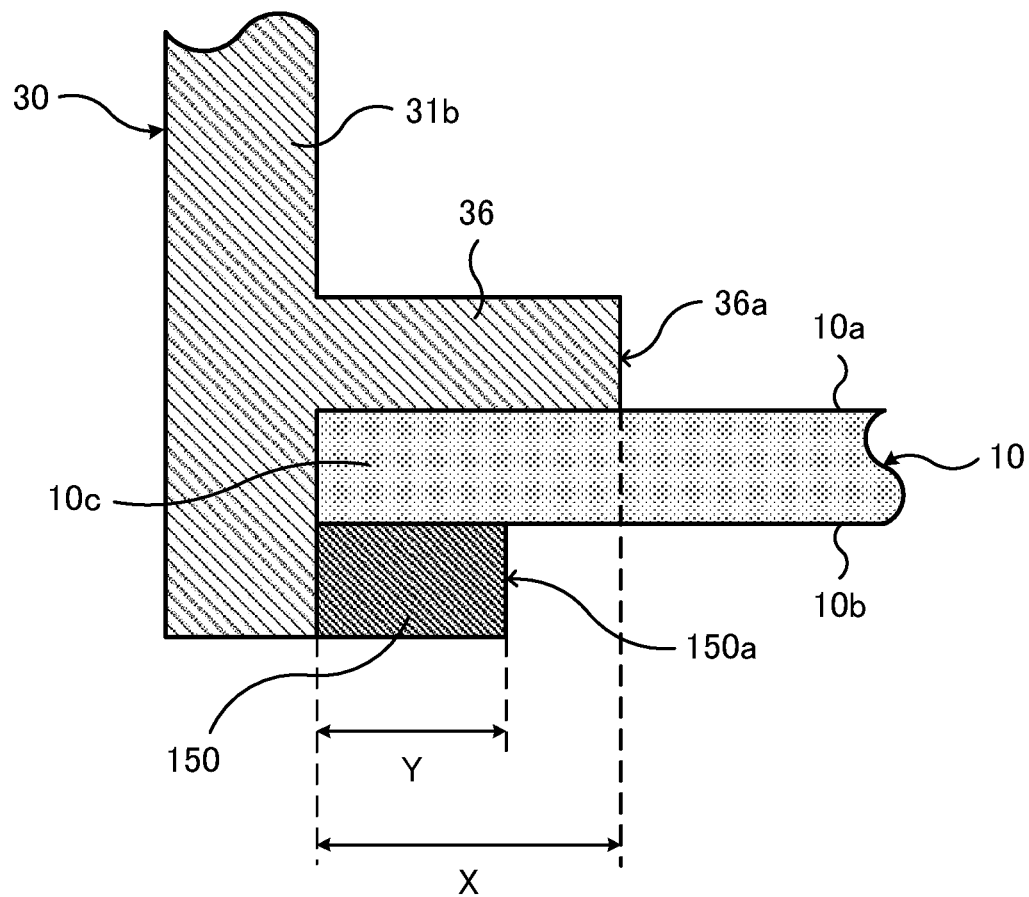
FIG. 19 depicts a relationship between a protrusion on a case housing and the spacer according to the sixth embodiment.

FIG. 19 depicts the relationship between the protrusion on the case housing and the spacer according to the sixth embodiment. FIG. 19 is a schematic cross-sectional view of a principal part of the case housing, the spacer ring, and the insulated substrate according to the sixth embodiment.

As described above, the spacer ring 150 is a member that serves as a pivot for exerting a force on the insulated substrate 10 pressed by the screw 40 so that the outer circumferential portion 10c of the insulated substrate 10 is pressed toward the protrusion 36 side of the case housing 30.

It is therefore desirable for the protrusion 36 of the case housing 30 and the spacer ring 150 to have the following relationship. As depicted in FIG. 19, when the length of the protrusion 36 of the case housing 30 from the side wall 31b to an edge 36a in a direction in which the protrusion 36 protrudes toward the insulated substrate 10 is defined as "X" and the length from the side wall 31b to the inner edge 150a of the spacer ring 150 is defined as "Y", the relationship "X>Y" is desirable. In other words, the inner edge 150a of the spacer ring 150 is located closer to the side wall 31b of the case housing 30 than the edge 36a of the protrusion 36 on the case housing 30. With this configuration, the insulated substrate 10 is pressed by the screw 40, a force is applied to the insulated substrate 10 with the spacer ring 150 as a pivot so that the outer circumferential portion 10c of the insulated substrate 10 is pressed toward the protrusion 36 of the case housing 30, and at the same time, it is possible to prevent the presence of the spacer ring 150 from hindering deformation of the insulated substrate 10.

Note that even when the spacer ring 150 is provided in this way, it is also possible to embed a nut 120 in the case housing 30 and screw the screw 40 into the nut 120 according to the example described above in the second embodiment.

Aside from this, it is also possible to provide a stress relieving layer 130 at the tip portion 42 of the screw 40 and to place the stress relieving layer 130 in contact with the insulated substrate 10 according to the example described above in the third embodiment.

In addition, it is possible to provide a screw receptacle 140 at a part of the insulated substrate 10 that faces the tip portion 42 of the screw 40 in accordance with the example described in the fourth embodiment.

It is also possible to provide the case housing 30 with a tubular insertion portion 35 that extends from the screw hole 33 toward the insulated substrate 10 side and into which the screw 40 is inserted in accordance with the example described above in the fifth embodiment.

Seventh Embodiment

Here, an example method of manufacturing a semiconductor device 1 as described in any of the first to sixth embodiments will be described as a seventh embodiment.

Figure 20:
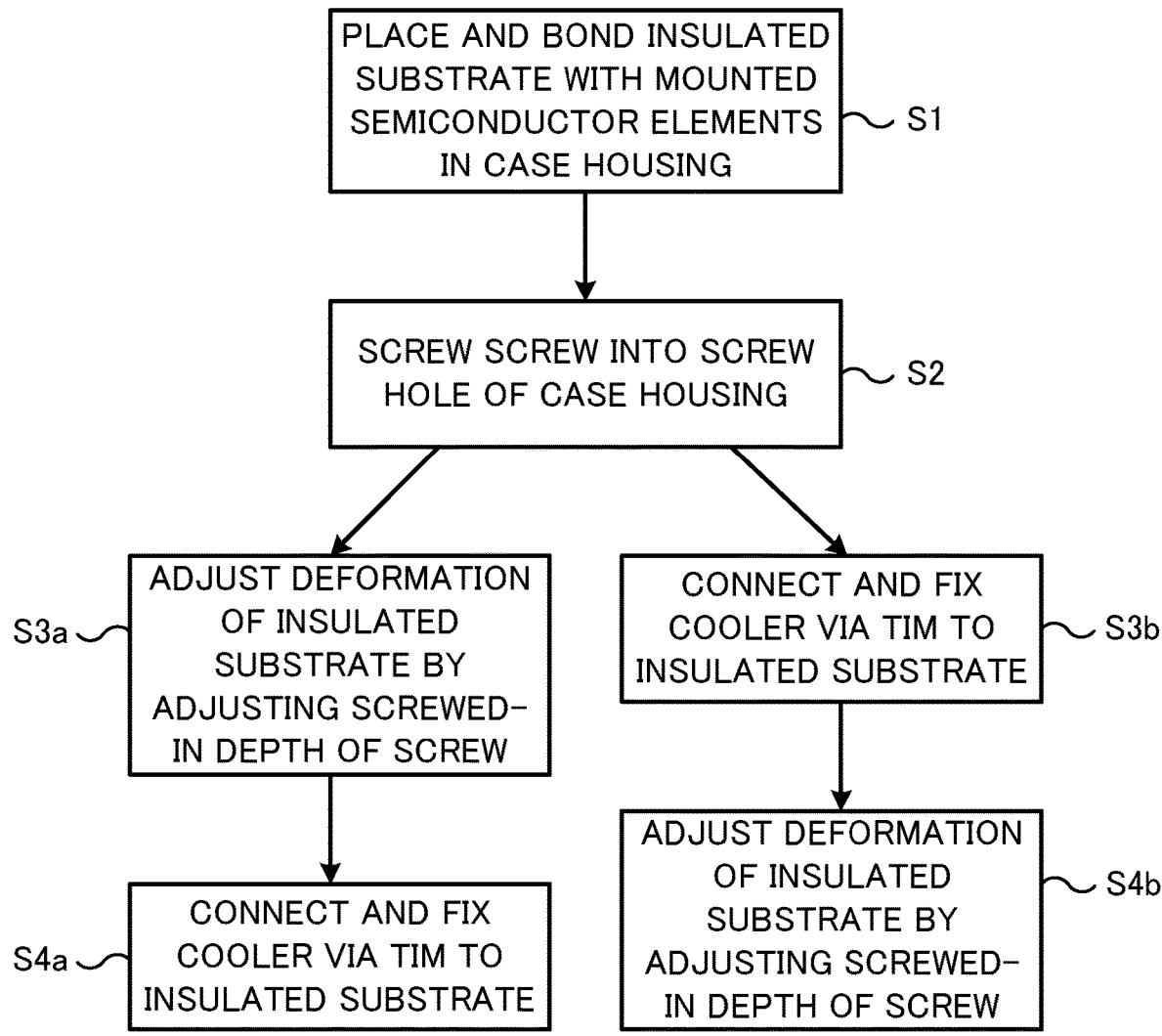
FIG. 20 depicts one example of a method of manufacturing a semiconductor device according to the seventh embodiment.

FIG. 20 depicts one example of a method of manufacturing a semiconductor device according to the seventh embodiment. A semiconductor device 1 as described above in the first to sixth embodiments may be manufactured using a method like that depicted in FIG. 20 for example.

First, the insulated substrate 10 that has the semiconductor elements 20 and the like mounted on the main surface 10a side is housed in the case housing 30, and the outer circumferential portion 10c of the insulated substrate 10 is bonded to the side wall 31b of the case housing 30 or to the protrusion 36 provided on the side wall 31b (step S1).

After the insulated substrate 10 has been housed and bonded, the screw 40 is screwed into the screw hole 33 provided in the case housing 30 or into the nut 120 that functions as the screw hole 33 (step S2). Note that at this point, there is no need to screw in the screw 40 so that the tip portion 42 of the screw 40 or the stress relieving layer 130 provided at the tip portion 42 contacts the main surface 10a of the insulated substrate 10 or the screw receptacle 140 provided on the main surface 10a of the insulated substrate 10.

After the screw 40 has been screwed in, as one example, the screwed-in depth may be adjusted to adjust the deformation of the insulated substrate 10 (step S3a). After the deformation of the insulated substrate 10 has been adjusted, the cooler 90 is connected via the TIM 80 to the main surface 10b side of the insulated substrate 10, and the case housing 30 and the cooler 90 are fixed using the screws 100 (step S4a).

As one example, the semiconductor device 1 is manufactured using a method including steps S1, S2, S3a, and S4a. Note that the device obtained by the steps up to step S2, the device obtained by the steps up to step S3a, or the device obtained by the steps up to step S4a may be regarded as the "semiconductor device 1". Encapsulation with the encapsulating resin 70 may be performed before or after step S2, after step S3a, or after step S4a.

Also, a semiconductor device 1 may also be manufactured by using the following method after the screw 40 has been screwed in in step S2. That is, after the screw 40 has been screwed in, the cooler 90 is connected via the TIM 80 to the main surface 10b side of the insulated substrate 10, and the case housing 30 and the cooler 90 are fixed by the screws 100 (step S3b). After this, the cooler 90 is connected and fixed, and the screwed-in depth of the screw 40 is then adjusted to adjust the deformation of the insulated substrate 10 (step S4b).

As one example, a semiconductor device 1 is manufactured using the method including steps S1, S2, S3b, and S4b. Note that the device obtained by the steps up to step S2, the device obtained by the steps up to step S3b, or the device obtained by the steps up to step S4b may be regarded as the "semiconductor device 1". Encapsulation with the encapsulating resin 70 may be performed before or after step S2, after step S3b, or after step S4b.

When manufacturing the semiconductor device 1, it is possible to use an example arrangement where steps S1, S2, and S3a are performed at the factory and step S4a is performed at the delivery destination. As another example, it is also possible to use an arrangement where steps S1 and S2 are performed at the factory and steps S3b and S4b are performed at the delivery destination.

According to one aspect, the present embodiments may realize a semiconductor device where deformation of an insulated substrate may be adjusted.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   an insulated substrate;
   a semiconductor element that is mounted on a first main surface side of the insulated substrate;
   a case housing that houses the insulated substrate and the semiconductor element so as to expose a second main surface side of the insulated substrate that is opposite to the first main surface side of the insulated substrate, the case housing being bonded to an outer circumferential portion of the insulated substrate, and having a flat upper wall and a first screw hole provided at the flat upper wall, the flat upper wall and the first screw hole facing the first main surface side of the insulated substrate; and
   a screw that is screwed into the first screw hole of the case housing and has a tip portion that contacts the first main surface side of the insulated substrate,
   wherein the case housing includes a tubular insertion portion, into which the screw is inserted, the insertion portion allowing a tip portion of the screw to protrude therefrom, and
   the semiconductor device further comprises a wall disposed on the first main surface side of the insulated substrate around a center thereof in a plan view of the semiconductor device, the wall surrounding the insertion portion of the case housing and the tip portion of the screw.

2. The semiconductor device according to claim 1, wherein the first screw hole is provided at a position that faces a center of the first main surface side of the insulated substrate in a plan view of the semiconductor device.

3. The semiconductor device according to claim 1, wherein
the insulated substrate includes a first conductive layer provided on the first main surface side, and
the tip portion of the screw contacts the first conductive layer.

4. The semiconductor device according to claim 1, wherein the screw includes a stress relieving layer provided at the tip portion.

5. The semiconductor device according to claim 1, further comprising a screw receptacle that is contacted by the tip portion of the screw and is provided at a position on the first main surface side of the insulated substrate that faces the first screw hole of the case housing.

6. The semiconductor device according to claim 5, wherein the screw receptacle includes a second screw hole into which the tip portion of the screw is screwed.

7. The semiconductor device according to claim 1, wherein
the case housing includes a nut that is embedded at a position facing the first main surface side of the insulated substrate, and
the first screw hole is a screw hole of the nut.

8. The semiconductor device according to claim 1, wherein
the case housing includes the side wall that surrounds the outer circumferential portion of the insulated substrate and a protrusion that protrudes from an inner surface of the side wall toward the insulated substrate and supports the insulated substrate from the first main surface side thereof, and
the insulated substrate is bonded to the side wall and the protrusion.

9. The semiconductor device according to claim 8, further comprising a spacer ring that is inside the side wall of the case housing and supports the insulated substrate from the second main surface side thereof, wherein
the spacer ring is bonded to the second main surface side of the insulated substrate and to the inner surface of the side wall of the case housing.

10. The semiconductor device according to claim 9, wherein an inside edge of the spacer ring is positioned closer to the inner surface of the side wall than is an edge of the protrusion of the case housing in a direction in which the protrusion protrudes from the inner surface of the side wall.

11. The semiconductor device according to claim 1, further comprising an encapsulating resin in an internal space of the case housing, that encapsulates the first main surface side of the insulated substrate and the semiconductor element.

12. The semiconductor device according to claim 1, further comprising a cooler that is provided via a thermal interface material on the second main surface side of the insulated substrate, the second main surface side of the insulated substrate being exposed from the case housing, the cooler being fixed to the case housing.

13. A method of manufacturing a semiconductor device, comprising:
housing an insulated substrate and a semiconductor element mounted on a first main surface side of the insulated substrate in a case housing, which has a flat upper wall and a screw hole provided at the flat upper wall, the flat upper wall and the screw hole facing the first main surface side of the insulated substrate so as to expose a second main surface side that is opposite to the first main surface side of the insulated substrate, and bonding an outer circumferential portion of the insulated substrate to the case housing; and
screwing a screw into the screw hole,
wherein the case housing includes a tubular insertion portion, into which the screw is inserted, the insertion portion allowing a tip portion of the screw to protrude therefrom, and
a wall is disposed on the first main surface side of the insulated substrate around a center thereof in a plan view of the semiconductor device, the wall surrounding the insertion portion of the case housing and the tip portion of the screw.

14. The method of manufacturing a semiconductor device according to claim 13, wherein the screwing a screw includes screwing the screw into the screw hole to place a tip portion of the screw in contact with the first main surface side of the insulated substrate and adjusting a screwed-in depth of the screw to adjust deformation of the insulated substrate.

15. The method of manufacturing a semiconductor device according to claim 13, further comprising
providing a cooler via a thermal interface material on the second main surface side of the insulated substrate, the second main surface side of the insulated substrate being exposed from the case housing, and
fixing the cooler to the case housing.

16. The semiconductor device according to claim 1, wherein an outer surface of the flat upper wall of the case housing in which the first screw hole is provided is a planar surface, and an upper surface of the screw screwed into the first screw hole of the case housing is flush with the outer surface of the flat upper wall.

17. The semiconductor device according to claim 1, wherein the wall has a prescribed height from the insulated substrate such that, when viewed from a direction parallel to a first main surface and orthogonal to a direction in which the insertion portion extends, the wall overlaps a tip of the insertion portion of the case housing and the tip portion of the screw.

* * * * *